(12) United States Patent
Park et al.

(10) Patent No.: US 12,382,593 B2
(45) Date of Patent: Aug. 5, 2025

(54) DISPLAY DEVICE

(71) Applicant: LG Display Co., Ltd., Seoul (KR)

(72) Inventors: GeunChang Park, Goyang-si (KR); ChounSung Kang, Gimpo-si (KR); Daeyun Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 345 days.

(21) Appl. No.: 17/964,895

(22) Filed: Oct. 12, 2022

(65) Prior Publication Data
US 2023/0164934 A1 May 25, 2023

(30) Foreign Application Priority Data
Nov. 24, 2021 (KR) .................. 10-2021-0163209

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC ............................ G06F 1/1652; H05K 5/0217
See application file for complete search history.

(56) References Cited

U.S. PATENT DOCUMENTS

| | | | | |
|---|---|---|---|---|
| 8,031,400 B2 * | 10/2011 | Wang | ...................... | G03B 21/58 359/461 |
| 10,362,690 B2 * | 7/2019 | Han | ...................... | H10K 59/871 |
| 10,782,740 B2 * | 9/2020 | Kim | ...................... | G06F 1/1601 |
| 10,890,947 B2 | 1/2021 | Choi | | |
| 11,127,320 B2 * | 9/2021 | Park | ...................... | H02K 33/02 |
| 11,706,885 B2 * | 7/2023 | Kim | ...................... | H05K 5/0217 361/807 |
| 12,054,103 B2 * | 8/2024 | Jang | ...................... | G09F 9/30 |
| 2007/0180745 A1 * | 8/2007 | Ofuji | ...................... | G03B 21/58 40/601 |
| 2009/0190212 A1 * | 7/2009 | Wang | ...................... | G03B 21/58 359/461 |
| 2011/0132557 A1 * | 6/2011 | Kuroi | ...................... | G03B 21/58 160/368.1 |
| 2014/0247544 A1 * | 9/2014 | Ryu | ...................... | G09F 15/0062 361/679.01 |
| 2015/0223358 A1 * | 8/2015 | Nam | ...................... | G06F 1/1652 74/102 |
| 2020/0013317 A1 * | 1/2020 | Cho | ...................... | G09F 9/301 |
| 2020/0035133 A1 * | 1/2020 | Pyo | ...................... | F16M 13/02 |
| 2020/0201394 A1 * | 6/2020 | Choi | ...................... | H05K 5/0017 |
| 2022/0071030 A1 * | 3/2022 | Li | ...................... | G06F 1/1652 |
| 2022/0369477 A1 * | 11/2022 | Jo | ...................... | H05K 5/0217 |
| 2023/0269889 A1 * | 8/2023 | Beschnitt | ...................... | H05K 5/0217 361/807 |

FOREIGN PATENT DOCUMENTS

KR 10-2020-0079002 A 7/2020

* cited by examiner

*Primary Examiner* — Sagar Shrestha
(74) *Attorney, Agent, or Firm* — Fenwick & West LLP

(57) ABSTRACT

According to an exemplary embodiment of the present disclosure, a display device includes a display unit including a display panel which displays an image, a head bar connected to an upper end of the display unit, a roller which is connected to a lower end of the display unit to ascend or descend the display unit, and four sets of spring units which are disposed on a rear surface of the display unit to intersect with respect to a gear unit, thereby minimizing loads of the display panel and the motor and maximizing an efficiency.

25 Claims, 28 Drawing Sheets

284b 285b 283b  284c 285c 283c   284a 285a 283a
  280b              280c              280a 284b 285b 283b 284c 285c 283c 284a 285a 283a
  280b             280c            280a 284b 285b 283b 284c 285c 283c 284a 285a 283a
  280b            280c            280a

|  | SECOND SPRING | THIRD SPRING | FIRST SPRING |
|---|---|---|---|
| K (N/mm) | 3.35 | 25.14 | 171.14 |
| LENGTH (mm) | 466.13 | 129.96 | 50.19 |
| APPLIED RANGE (mm) | 218.07 ~ 327.11 | 74.28 ~ 111.42 | 31.65 ~ 47.47 |

DISPLAY DEVICE

CROSS-REFERENCE TO RELATED APPLICATIONS

This application claims the priority of Korean Patent Application No. 10-2021-0163209 filed on Nov. 24, 2021, in the Korean Intellectual Property Office, the disclosure of which is incorporated herein by reference.

BACKGROUND

Field

The present disclosure relates to a display device, and more particularly, to a rollable display device which is capable of displaying images even in a rolled state.

Description of the Related Art

As display devices which are used for a monitor of a computer, a television, or a cellular phone, there is an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a rollable display device which is manufactured by forming a display element and a wiring line on a flexible substrate such as plastic which is a flexible material so as to be capable of displaying images even in a rolled state is getting attention as a next generation display device.

SUMMARY

An object to be achieved by the present disclosure is to provide a rollable display device which simplifies a driving unit at a low cost without lowering the efficiency.

Objects of the present disclosure are not limited to the above-mentioned objects, and other objects, which are not mentioned above, can be clearly understood by those skilled in the art from the following descriptions.

In order to achieve the above-described objects, according to an aspect of the present disclosure, a display device includes a display unit including a display panel which displays an image, a head bar connected to an upper end of the display unit, a roller which is connected to a lower end of the display unit to ascend or descend the display unit, and four sets of spring units which are disposed on a rear surface of the display unit to intersect with respect to a gear unit.

According to another aspect of the present disclosure, a display device includes a display unit including a display panel which displays an image, a head bar connected to an upper end of the display unit, a roller which is connected to a lower end of the display unit to ascend or descend the display unit, and a spring unit which is disposed on a rear surface of the display unit and is configured by two sets of upper stages and lower stages to move to be spaced apart from each other or close to each other in accordance with a rotation direction of the roller.

Other detailed matters of the exemplary embodiments are included in the detailed description and the drawings.

According to the present disclosure, a compression spring is configured by two or more stages to be used as a link unit so that a load of a motor is reduced, and the driving unit is simplified. As a result, an effect of reducing a cost of the driving unit with a simple structure may be provided.

According to the present disclosure, a two-stage spring structure is used to minimize the load of the display panel and the motor, and a constant torque is implemented in the entire period, thereby maximizing the efficiency.

According to still another embodiment of the present disclosure, a display device comprises a display panel configured to display an image; a roller coupled to the display panel and configured to wind the display panel in a first circular direction or unwind the display panel in a second circular direction; and a lifting unit coupled to the display panel and configured to move the display panel in a first vertical direction in response to the roller moving in the first circular direction or in a second vertical direction opposite the first vertical direction in response to the roller moving in the second circular direction, wherein the lifting unit includes a plurality of spring units, each of the spring units configured to compress in response to the roller moving in the first circular direction or decompress in response to the roller moving in the second circular direction.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1A:
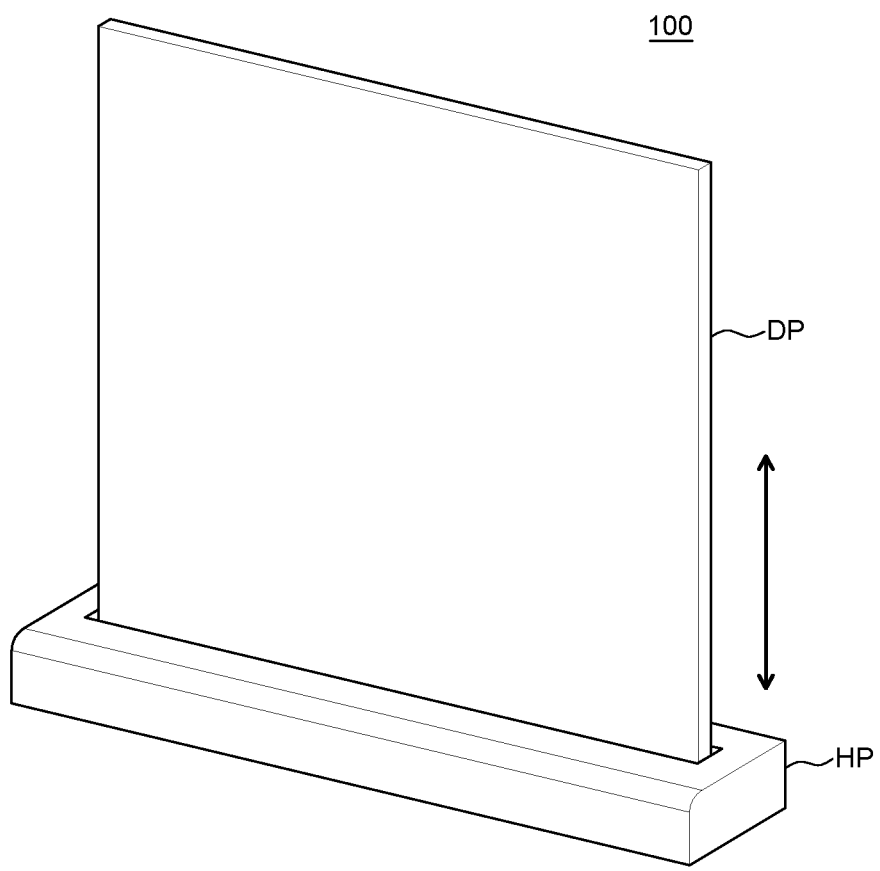
FIGS. 1A and 1B are perspective views of a display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to the drawings.

A rollable display device may be referred to as a display device which is capable of displaying images even though it is rolled. The rollable display device may have a high flexibility as compared with a general display device of the related art. Depending on whether to use a rollable display device, a shape of the rollable display device may freely vary. Specifically, when the rollable display device is not used, the rollable display device is rolled to be stored with a reduced volume. In contrast, when the rollable display device is used, the rolled rollable display device is unrolled to be used.

Figure 1B:
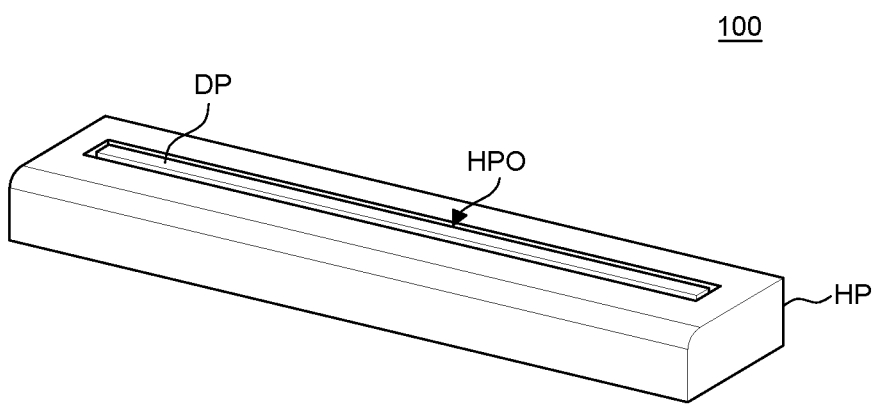

FIGS. 1A and 1B are perspective views of a display device according to a first exemplary embodiment of the present disclosure.

Referring to FIGS. 1A and 1B, a display device 100 according to a first exemplary embodiment of the present disclosure includes a display unit DP and a housing unit HP.

The display unit DP is a configuration for displaying images to a user and for example, in the display unit DP, a display element and a circuit, a wiring line, and a component for driving the display element may be disposed. The display device 100 according to the first exemplary embodiment of the present disclosure may be configured such that the display unit DP is wound or unwound. The display unit DP may be configured by a display panel and a back cover which have a flexibility to be wound or unwound. The display unit DP will be described below in more detail with reference to FIGS. 2 and 3.

The housing unit HP is a case in which the display unit DP is accommodated. The display unit DP may be wound to be accommodated in the housing unit HP and the display unit DP may be unwound to be disposed at the outside of the housing unit HP.

The housing unit HP may have an opening HPO so that the display unit DP and a driving unit (not illustrated) move to the inside and the outside of the housing unit HP. That is, the display unit DP and the driving unit may move in a vertical direction by passing through the opening HPO of the housing unit HP. The driving unit will be described below in more detail with reference to FIGS. 4A to 7.

The display unit DP of the display device 100 may be switched from a fully unwound state to a fully wound state or from a fully wound state to a fully unwound state.

FIG. 1A illustrates the display unit DP of the display device 100 which is fully unwound as an example and in the fully unwound state, the display unit DP of the display device 100 is disposed at the outside of the housing unit HP. That is, in order for a user to watch images through the display device 100, when the display unit DP is unwound to be disposed at the outside of the housing unit HP as much as possible and cannot be further unwound any more, it may be defined as a fully unwound state.

FIG. 1B illustrates the display unit DP of the display device 100 which is fully wound as an example and in the fully wound state, the display unit DP of the display device 100 is accommodated in the housing unit HP and cannot be further wound. That is, when the user does not watch the images through the display device 100, it is advantageous from the viewpoint of an outer appearance that the display unit DP is not disposed at the outside of the housing unit HP. Therefore, when the display unit DP is wound to be accommodated in the housing unit HP, it is defined as a fully wound state. Further, when the display unit DP is in a fully wound state to be accommodated in the housing unit HP, a volume of the display device 100 is reduced and the display device 100 may be easily carried.

In order to switch the display unit DP to a fully unwound state or a fully wound state, a driving unit which winds or unwinds the display unit DP may be disposed.

Hereinafter, the display unit DP will be described in more detail with reference to FIGS. 2 and 3.

Figure 2:
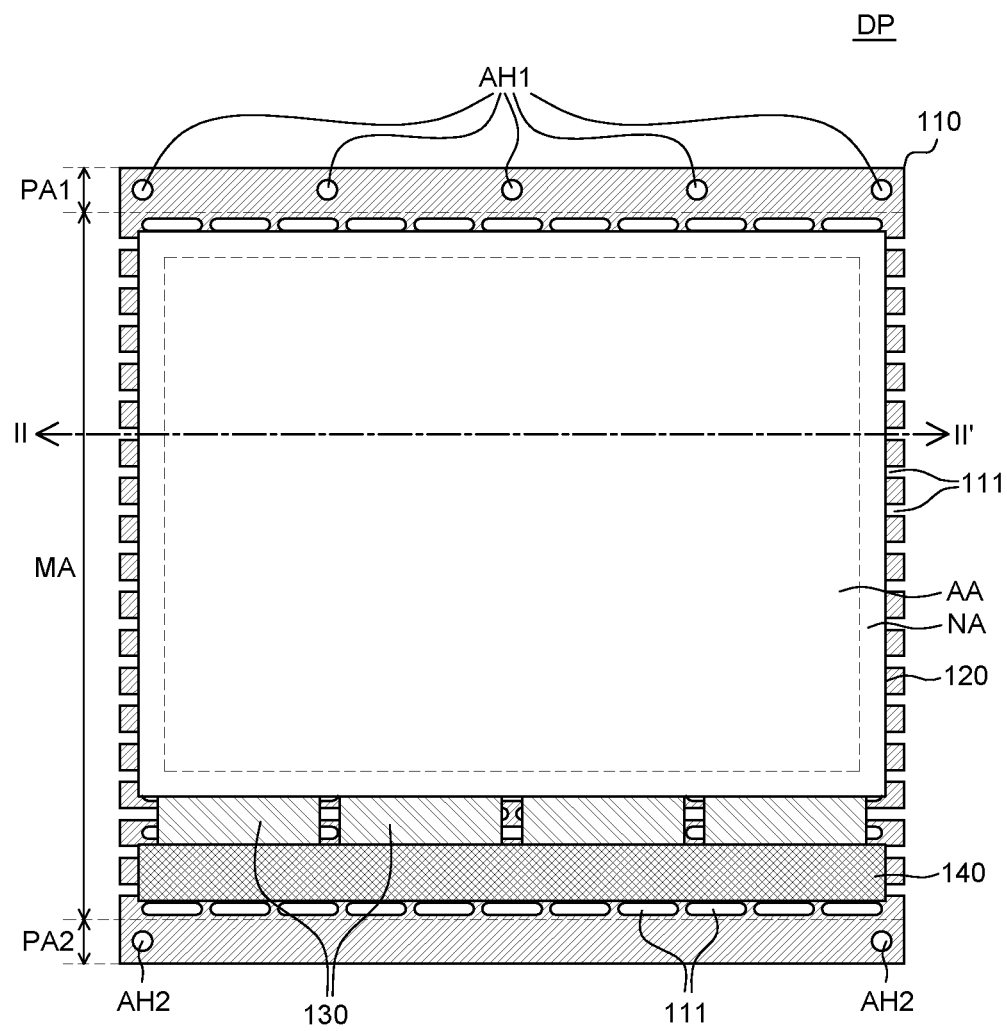
FIG. 2 is a plan view of a display unit of a display device according to a first exemplary embodiment of the present disclosure.

FIG. 2 is a plan view of a display unit of a display device according to a first exemplary embodiment of the present disclosure.

Figure 3:
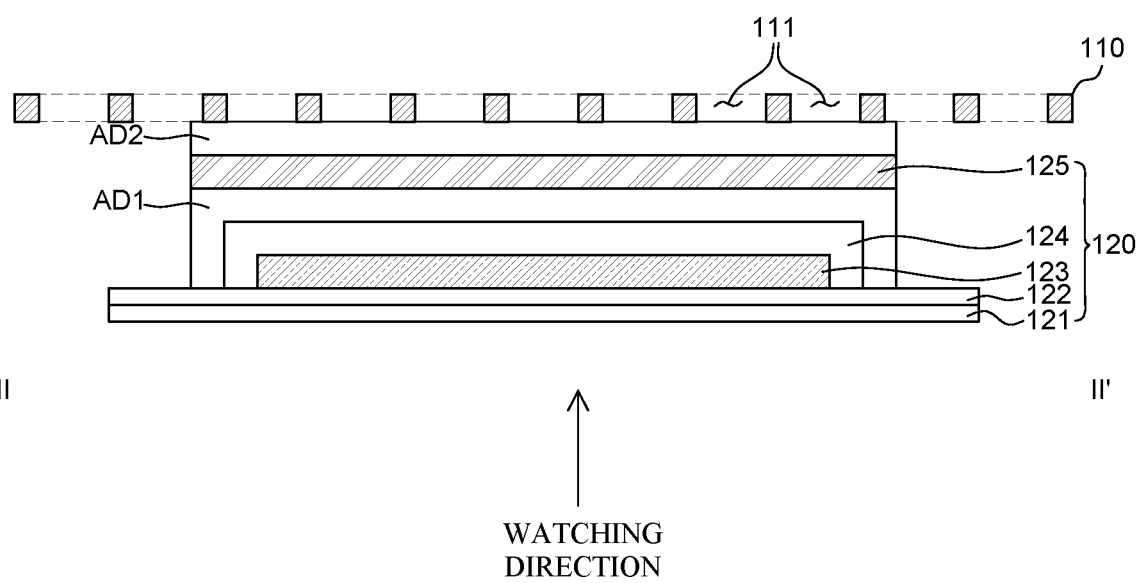
FIG. 3 is a cross-sectional view taken along the line II-II' of FIG. 2.

FIG. 3 is a cross-sectional view taken along the line II-II' of FIG. 2.

Referring to FIGS. 2 and 3, the display unit DP includes a back cover 110, a display panel 120, a flexible film 130, and a printed circuit board 140.

The display panel 120 is a panel for displaying images to a user.

The display panel 120 may include a display element which displays images, a driving element which drives the display element, and wiring lines which transmit various signals to the display element and the driving element. The display element may be defined in different ways depending on a type of the display panel 120. For example, when the display panel 120 is an organic light emitting display panel, the display element may be an organic light emitting diode which includes an anode, an organic light emitting layer, and a cathode. For example, when the display panel 120 is a liquid crystal display panel, the display element may be a liquid crystal display element. Hereinafter, even though the display panel 120 is assumed as an organic light emitting display panel, the display panel 120 is not limited to the organic light emitting display panel.

Further, since the display device according to the first exemplary embodiment of the present disclosure is a rollable display device, the display panel 120 may be implemented as a flexible display panel to be wound around or unwound from the roller.

The display panel 120 includes an active area AA and a non-active area NA.

The active area AA is an area where images are displayed in the display panel 120.

In the active area AA, a plurality of sub pixels which configures the plurality of pixels and a circuit for driving the plurality of sub pixels may be disposed. The plurality of sub pixels are minimum units which configure the active area AA and a display element may be disposed in each of the plurality of sub pixels. The plurality of sub pixels may configure a pixel. For example, an organic light emitting diode which includes an anode, an organic light emitting layer, and a cathode may be disposed in each of the plurality of sub pixels, but it is not limited thereto. Further, a circuit for driving the plurality of sub pixels may include a driving element and a wiring line. For example, the circuit may be configured by a thin film transistor, a storage capacitor, a gate line, and a data line, but is not limited thereto.

The non-active area NA is an area where no image is displayed.

In the non-active area NA, various wiring lines and circuits for driving the organic light emitting diode of the active area AA are disposed. For example, in the non-active area NA, a link line which transmits signals to the plurality of sub pixels and circuits of the active area AA or a driving IC such as a gate driver IC or a data driver IC may be disposed, but it is not limited thereto.

The flexible film 130 is a film in which various components are disposed on a base film having a malleability. Specifically, the flexible film 130 is a film which supplies a signal to the plurality of sub pixels and the circuits of the display area AA and is electrically connected to the display panel 120. The flexible film 130 is disposed at one end of the non-display area NA of the display panel 120 to supply a power voltage or a data voltage to the plurality of sub pixels and the circuits of the display area AA.

In the meantime, for example, a driving IC such as a gate driver IC or a data driver IC may be disposed on the flexible film 130. The driving IC is a component which processes data for displaying images and a driving signal for processing the data. The driving IC may be disposed by a chip on glass (COG), a chip on film (COF), or a tape carrier package (TCP) depending on a mounting method. However, for the convenience of description, it is described that the driving IC is mounted on the flexible film 130 by a chip on film manner, but is not limited thereto.

The printed circuit board 140 is disposed at one end of the flexible film 130 to be connected to the flexible film 130. The printed circuit board 140 is a component which supplies signals to the driving IC. The printed circuit board 140 supplies various signals such as a driving signal or a data signal to the driving IC. For example, a data driving unit which generates data signals may be mounted in the printed circuit board 140, and the generated data signal may be supplied to the plurality of sub pixels and the circuit of the display panel 120 through the flexible film 130.

The back cover 110 is disposed on rear surfaces of the display panel 120, the flexible film 130, and the printed circuit board 140 to support the display panel 120, the flexible film 130, and the printed circuit board 140. Therefore, a size of the back cover 110 may be larger than a size of the display panel 120. Therefore, the back cover 110 may protect other configurations of the display unit DP from the outside. Even though the back cover 110 is formed of a material having a rigidity, at least a part of the back cover 110 may have a flexibility to be wound and unwound together with the display panel 120. For example, the back cover 110 may be formed of a metal material such as steel use stainless (SUS) or invar or plastic. As long as a material of the back cover 110 satisfies physical conditions such as a thermal strain amount, a radius of curvature, and a rigidity, various materials may be used, and is not limited thereto.

In the meantime, the back cover 110 may include a plurality of openings 111.

The plurality of openings 111 may allow the back cover 110 to have a flexibility. The plurality of openings 111 may be flexibly deformed and allow the first cover 110 to be wound around the roller or unwound from the roller together with the display panel 120.

The back cover 110 includes a support area PA and a malleable area MA. That is, the back cover 110 includes a first support area PA1 at an uppermost end, a second support area PA2 at a lowermost end, and a malleable area MA between the first support area PA1 and the second support rea PA2.

The first support area PA1 of the back cover 110 is an uppermost area of the back cover 110 and is fastened with a head bar. In the first support area PA1, first fastening holes AH1 are formed to be fastened with the head bar. As the first support area PA1 is fastened with the head bar, when the driving unit which is fastened with the head bar is lifted or lowered, the back cover 110 is also lifted or lowered and the display panel 120 which is attached to the back cover 110 is also lifted or lowered.

The second support area PA2 of the back cover 110 is a lowermost area of the back cover 110 and is fastened with the roller. The second support area PA2 may include second fastening holes AH2 to be fastened with the roller. As the second support area PA2 is fastened with the roller, the back cover 110 may be wound around or unwound from the roller by the rotation of the roller.

The malleable area MA of the back cover 110 is an area which is wound around or unwound from the roller together with the display panel 120. At this time, the malleable area MA may overlap at least the display panel 120 among other configurations of the display unit DP.

A plurality of openings 111 are disposed in the malleable area MA of the back cover 110. When the display unit DP is wound or unwound, the plurality of openings 111 may be deformed by a stress which is applied to the display unit DP. Specifically, when the display unit DP is wound or unwound, the malleable areas MA of the back cover 110 may be deformed as the plurality of openings 111 contract or expand. Further, as the plurality of openings 111 contract or expand, a slip phenomenon of the display panel 120 disposed in the malleable areas MA of the back cover 110 is minimized so that the stress which is applied to the display panel 120 may be minimized.

Referring to FIG. 3, the display panel 120 includes a substrate 121, a buffer layer 122, a pixel unit 123, an encapsulation layer 124, and an encapsulation substrate 125.

The substrate 121 is a base member which supports various components of the display panel 120 and may be configured by an insulating material. The substrate 121 may be formed of a material having a flexibility to allow the display panel 120 to be wound or unwound and for example, may be formed of a plastic material such as polyimide (PI).

The buffer layer 122 suppresses moisture and/or oxygen which penetrates from the outside of the substrate 121 from being spread. The buffer layer 122 may be configured by a single layer or a double layer of silicon oxide SiOx and silicon nitride SiNx, but is not limited thereto.

The pixel unit 123 includes a plurality of organic light emitting diodes and a circuit for driving the organic light emitting diodes. The pixel unit 123 may be an area corresponding to the active area AA. The organic light emitting diode may include an anode, an organic light emitting layer, and a cathode.

The anode may supply holes to the organic light emitting layer and be formed of a conductive material having a high work function. For example, the anode may be formed of tin oxide (TO), indium tin oxide (ITO), indium zinc oxide (IZO), or indium zinc tin oxide (ITZO), but is not limited thereto.

The organic light emitting layer is supplied with holes from the anode and supplied with electrons from the cathode to emit light. The organic light emitting layer may be formed of a red organic light emitting layer, a green organic light emitting layer, a blue organic light emitting layer, and a white organic light emitting layer depending on a color of light emitted from the organic light emitting layer. In this case, when the organic light emitting layer is a white organic light emitting layer, color filters having various colors may be additionally disposed.

The cathode may supply electrons to the organic light emitting layer and be formed of a conductive material having a low work function. For example, the cathode may be formed of any one or more selected from a group consisting of metals, such as magnesium (Mg), silver (Ag), and aluminum (Al), and an alloy thereof, but is not limited thereto.

The display panel 120 may be configured as a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed only of a transparent conductive material and the cathode may be formed of the metal material having a high reflectance to allow the light emitted from the organic light emitting diode to travel to the lower portion of the substrate 121.

A circuit for driving the organic light emitting diode is disposed in the pixel unit 123. The circuit may be formed of a thin film transistor, a storage capacitor, a gate line, a data line, and a power line, but it may vary in various forms depending on the design of the display device 100.

The encapsulation layer 124 which covers the pixel unit 123 is disposed on the pixel unit 123. The encapsulation layer 124 seals the organic light emitting diode of the pixel unit 123. The encapsulation layer 124 may protect the organic light emitting diode of the pixel unit 123 from moisture, oxygen, and impacts of the outside. The encapsulation layer 124 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may use epoxy or acrylic polymer, but they are not limited thereto.

The encapsulation substrate 125 is disposed on the encapsulation layer 124. The encapsulation substrate 125 protects the organic light emitting diode of the pixel unit 123 together with the encapsulation layer 124. The encapsulation substrate 125 may protect the organic light emitting diode of the pixel unit 123 from moisture, oxygen, and impacts of the outside. The encapsulation substrate 125 may be formed of a metal material, which has a high corrosion resistance and is easily processed in the form of a foil or a thin film, such as aluminum (Al), nickel (Ni), chromium (Cr), and an alloy material of iron (Fe) and nickel.

A first adhesive layer AD1 may be disposed between the encapsulation layer 124 and the encapsulation substrate 125. The first adhesive layer AD1 may bond the encapsulation layer 124 and the encapsulation substrate 125 to each other. At this time, the first adhesive layer AD1 is formed of a material having adhesiveness and may be a thermosetting or natural curable type adhesive. For example, the first adhesive layer AD1 may be formed of an optical clear adhesive (OCA) or a pressure sensitive adhesive (PSA), but is not limited thereto.

In the meantime, the first adhesive layer AD1 may be disposed so as to enclose the encapsulation layer 124 and the pixel unit 123. That is, the pixel unit 123 may be sealed by the buffer layer 122 and the encapsulation layer 124 and the encapsulation layer 124 and the pixel unit 123 may be sealed by the buffer layer 122 and the first adhesive layer AD1. The first adhesive layer AD1 may protect the organic light emitting diode of the pixel unit 123 from moisture, oxygen, and impacts of the outside together with the encapsulation layer 124 and the encapsulation substrate 125. In this case, the first adhesive layer AD1 may further include an absorbent. The absorbent may be particles having hygroscopicity and absorb moisture and oxygen from the outside to minimize permeation of the moisture and oxygen into the pixel unit 123.

The back cover 110 may be disposed on the encapsulation substrate 125. The back cover 110 is disposed to be in contact with the encapsulation substrate 125 of the display panel 120 to protect the display panel 120.

In the meantime, the back cover 110 may include a plurality of openings 111.

A second adhesive layer AD2 may be disposed between the encapsulation substrate 125 and the back cover 110. The second adhesive layer AD2 may bond the encapsulation substrate 125 and the back cover 110 to each other. At this time, the second adhesive layer AD2 is formed of a material having adhesiveness and may be a thermosetting or natural curable type adhesive. For example, the second adhesive layer AD2 may be formed of an optical clear adhesive (OCA) or a pressure sensitive adhesive (PSA), but is not limited thereto.

Even though in FIG. 3, it is illustrated that the plurality of openings 111 of the back cover 110 are not filled with the second adhesive layer AD2, the second adhesive layer AD2 may be filled in some or all of the plurality of openings 111. If the second adhesive layer AD2 is filled in the plurality of openings 111 of the back cover 110, a contact area between the second adhesive layer AD2 and the back cover 110 is increased so that a separation phenomenon may be avoided.

Figure 4A:
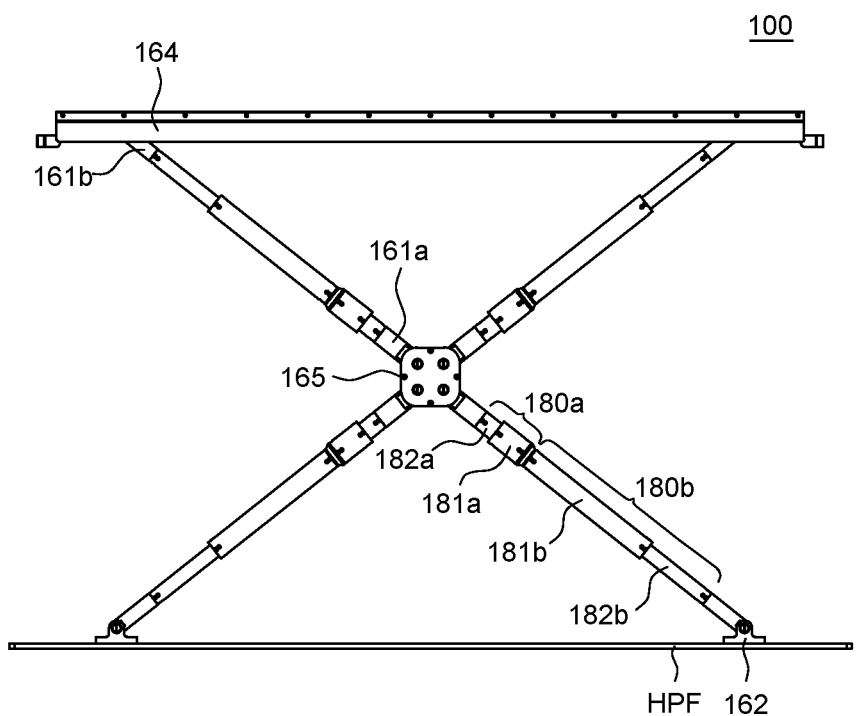
FIG. 4A is a schematic front view of a display device according to a first exemplary embodiment of the present disclosure.

FIG. 4A is a schematic front view of a display device according to a first exemplary embodiment of the present disclosure.

Figure 4B:
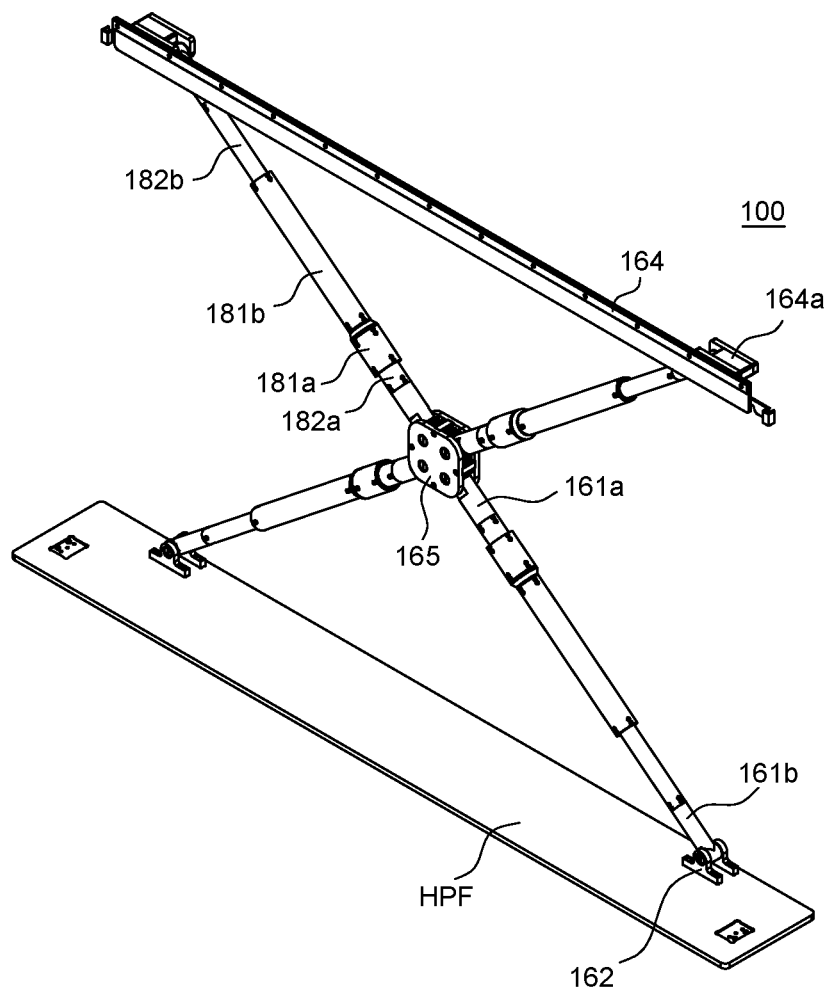
FIG. 4B is a schematic perspective view of a display device according to a first exemplary embodiment of the present disclosure.

FIG. 4B is a schematic perspective view of a display device according to a first exemplary embodiment of the present disclosure.

Figure 5:
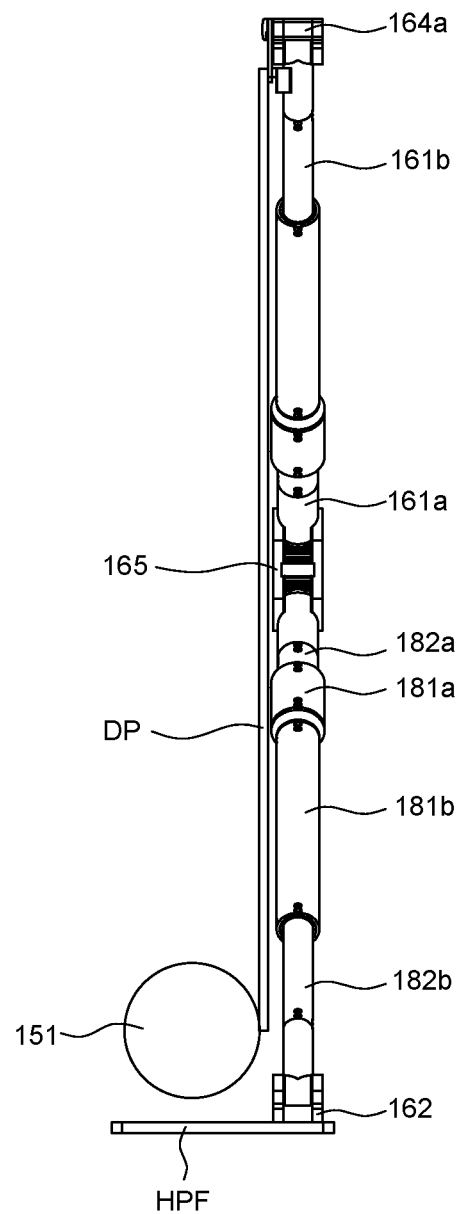
FIG. 5 is a side view of a display device according to a first exemplary embodiment of the present disclosure.

FIG. 5 is a schematic side view of a display device according to a first exemplary embodiment of the present disclosure.

Figure 6A:
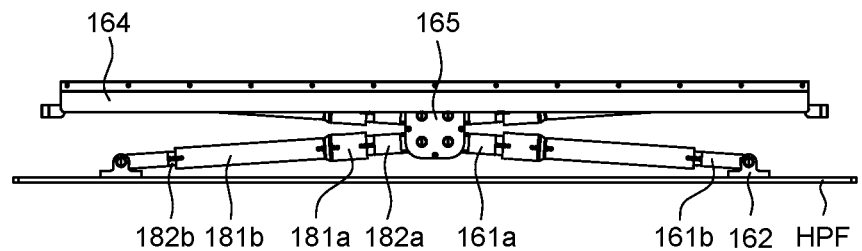
FIG. 6A is a schematic front view of a display device according to a first exemplary embodiment of the present disclosure.

FIG. 6A is a schematic front view of a display device according to a first exemplary embodiment of the present disclosure.

Figure 6B:
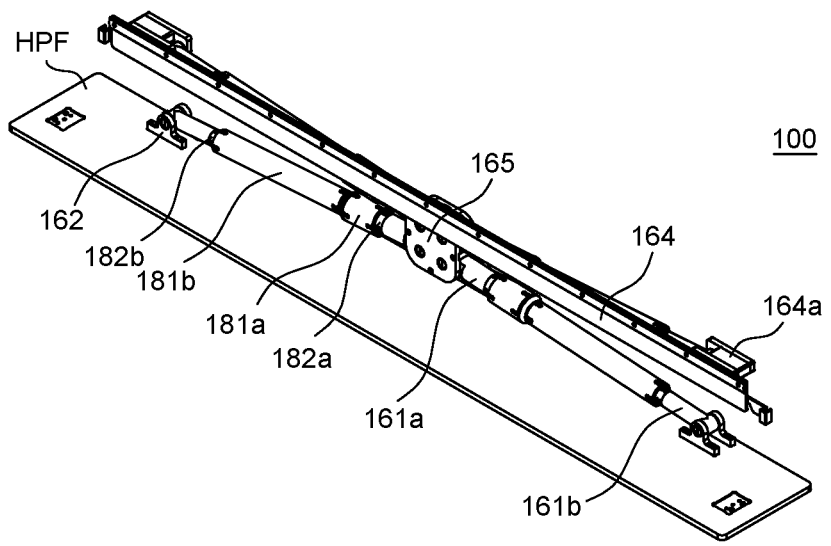
FIG. 6B is a schematic perspective view of a display device according to a first exemplary embodiment of the present disclosure.

FIG. 6B is a schematic perspective view of a display device according to a first exemplary embodiment of the present disclosure.

Figure 7:
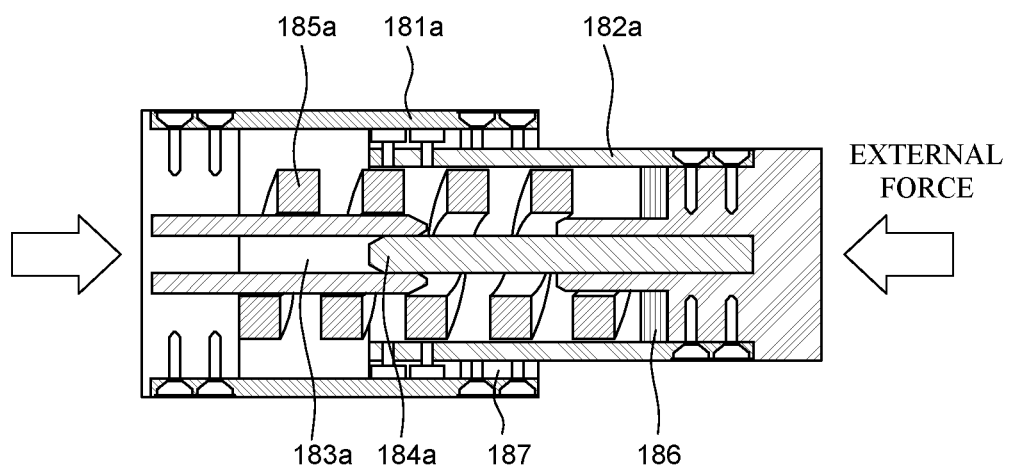
FIG. 7 is a cross-sectional view illustrating a part of a first spring unit.

FIG. 7 is a cross-sectional view illustrating a part of a first spring unit.

FIGS. 4A and 4B are a front view and a perspective view illustrating a fully unwound state of the display unit DP of the display device 100 as an example and FIGS. 6A and 6B are perspective views illustrating a fully wound state of the display unit DP of the display device 100 as an example.

In FIGS. 4A, 4B, 6A, and 6B, for the sake of convenience, the display unit DP, the roller unit, and the motion converting unit are not illustrated and in FIG. 5, parts of the display unit DP and the roller unit are schematically illustrated.

Referring to FIGS. 4A to 6B, and 7, the driving unit includes a roller unit, a lifting unit 160, and a motion converting unit (not illustrated).

The roller unit includes a roller 151 and a roller support unit (not illustrated).

The roller 151 rotates in a clockwise direction or a counterclockwise direction to wind or unwind the display unit DP fixed to the roller unit.

The roller 151 is a member around which the display unit DP is wound. The roller 151 may be, for example, formed to have a cylindrical shape. A lower edge of the display unit DP may be fixed to the roller 151. At this time, when the roller 151 rotates, the display unit DP which is fixed to the roller 151 through the lower edge may be wound around the roller 151. In contrast, when the roller 151 rotates in an opposite direction, the display unit DP which is wound around the roller 151 may be unwound from the roller 151.

Even though it is not illustrated, the roller support unit is disposed on a bottom surface HPF of the housing unit and an upper side surface of the roller support unit may be coupled to both ends of the roller 151. Therefore, the roller support unit may support the roller 151 to be spaced apart from the bottom surface HPF of the housing unit. The roller 151 may be rotatably coupled to the roller support unit.

The lifting unit 160 moves the display unit DP in a vertical direction in accordance with the rotational driving of the roller 151.

The lifting unit 160 includes a spring unit 180, a head bar 164, and a gear unit 165.

The spring unit 180 includes four sets of first spring units 180*a* and second spring units 180*b* which intersect each other in a shape of scissors, with respect to the gear unit 165. Specifically, the spring unit 180 includes four sets of first spring units 180*a* and second spring units 180*b* and the four sets of first spring units 180*a* and second spring units 180*b* intersect in a shape of scissors to be rotatably fastened via the gear unit 165.

In the first exemplary embodiment of the present disclosure, instead of moving the link with a motor of the related art, the motor rotates the roller 151 and utilizes the four sets of spring units 180 as links.

That is, according to the related art, the spring is embodied in the roller to apply a tension to the display panel and the motor moves the link. However, in this case, due to the driving characteristic, there is a problem in that a high torque at a low speed is necessary in an initial stage and a low torque at a high speed is necessary in a later stage so that the efficiency is degraded. At this time, when a shift is added in the middle of the power transmission structure from the motor to the link, the power may be efficiently used, but a space and a cost are required to add a shift structure. Further, the link is moved using an expensive ball screw, which increases the cost.

Therefore, according to the first exemplary embodiment of the present disclosure, the motor is connected to the roller 151 to be rotated and the link is replaced with the spring 185*a*. That is, the motor is connected to the roller 151 to rotate the roller 151 and four sets of spring units 180 apply the tension to the display unit DP so that an upper spring unit 180 and a lower spring unit 180 move along a rotation direction of the roller 151 to be spaced apart from each other or close to each other. Further, the gear unit 165 is installed at the center at which one ends of the upper spring unit 180 and the lower spring unit 180 meet to suppress the unnecessary degree of freedom of the spring 185*a* to allow more stable operation. One ends of the four sets of spring units 180 are fastened with inner connection units 161*a*, and four inner connection units 161*a* may be connected to be engaged with the gear unit 165.

In the meantime, the head bar 164 of the lifting unit 160 is fixed to an uppermost end of the display unit DP. The head bar 164 is connected to the spring unit 180 by means of the first connection unit 164*a* and moves in a vertical direction together with the display unit DP in accordance with the rotation of the roller 151. That is, the display unit DP may move in a vertical direction by the head bar 164 and the spring unit 180. The display unit DP upwardly moves by the driving of the motor and the rotation of the roller 151 and downwardly moves by a restoration force of the compressed spring 185*a* of the spring unit 180.

The head bar 164 covers only a part of a surface which is adjacent to an uppermost edge of the display unit DP so as not to block an image displayed on the top surface of the display unit DP. The display unit DP and the head bar 164 may be fixed by a screw, but are not limited thereto. The head bar 164 is connected to an outer connection unit 161*b* fastened with the upper spring unit 180 by means of a first connection unit 164*a* which protrudes from both rear surfaces so that the outer connection unit 161*b* is rotatably coupled to the first connection unit 164*a*.

In the meantime, the outer connection unit 161*b* fastened with the lower spring unit 180 is rotatably connected to the second connection unit 162 provided on the bottom surface HPF.

Four sets of spring units 180 configure a link and each set of spring units 180 includes a first spring unit 180*a* and a second spring unit 180*b*, but it is not limited thereto so that the set of spring units may be configured by two (or two stages) or more spring units.

The first spring unit 180*a* is located inside, but the second spring unit 180*b* is located at the outside, with respect to the gear unit 165.

As described above, according to the first exemplary embodiment of the present disclosure, the spring unit 180 is configured by two stages of the first spring unit 180*a* and the second spring unit 180*b* to improve the efficiency, which will be described below.

Further, according to the first exemplary embodiment of the present disclosure, the first spring unit 180*a* is configured by a first spring 185*a* (FIG. 7) having a relatively large spring constant and the second spring unit 180*b* is configured by a second spring having a relatively small spring constant. In this case, a length of the second spring may be formed to be longer than a length of the first spring 185*a* so that a length of the second spring unit 180*b* is also formed to be longer than a length of the first spring unit 180*a*, but is not limited thereto.

In the meantime, one spring unit 180, that is, the first spring unit 180*a* includes first cases 181*a* and 182*a* which accommodate the first spring 185*a* and first shafts 183*a* and 184*a* (FIG. 7).

The second spring unit 180*b* includes second cases 181*b* and 182*b* which accommodate a second spring and a second shaft. As described above, when the length of the second spring is formed to be longer than the length of the first spring 185*a*, the overall length of the second cases 181*b* and 182*b* is also formed to be longer than the overall length of the first cases 181*a* and 182*a*.

For example, the first cases 181*a* and 182*a* are configured by an outer first case 181*a* which configures an external case so as not to expose the first spring 185*a*, has a hollow cylindrical shape, and has a larger outer diameter and an inner first case 182*a* having a smaller outer diameter. Therefore, the inner first case 182*a* is inserted into the outer first case 181*a*.

Further, the second cases 181*b* and 182*b* are configured by an outer second case 181*b* which configures an external case so as not to expose the second spring, has a hollow cylindrical shape, and has a larger outer diameter and an internal second case 182*b* having a smaller outer diameter. Therefore, the inner second case 182*b* is inserted into the inner first case 181*b*.

In FIGS. 4A to 6B, an example that the outer first case 181*a* of the first spring unit 180*a* and the outer second case 181*b* of the second spring unit 180*b* are in contact with each other to be fastened has been illustrated, but the present disclosure is not limited thereto.

The first shafts 183*a* and 184*a* are configured by an outer first shaft 183*a* which is provided in the outer first case 181*a* and has a hollow cylindrical shape and an inner first shaft 184*a* which is provided in the inner first case 182*a* and is inserted into the outer first shaft 183*a*. Further, the second shaft is configured by an outer second shaft which is provided in the outer second case 181*a* and has a hollow cylindrical shape and an inner second shaft which is provided in the inner second case 182*b* and is inserted into the outer second shaft.

The first spring 185*a* and the second spring may be repeatedly compressed, and uncompressed while being fitted into the first shafts 183*a* and 184*a* and the second shaft.

As described above, according to the first exemplary embodiment of the present disclosure, the first shafts 183*a* and 184*a* and the second shaft therein suppress the buckling of the first spring 185*a* and the second spring and are supplemented by the first cases 181*a* and 182*a* and the second cases 181*b* and 182*b* at the outside. Further, the first cases 181*a* and 182*a* and the second cases 181*b* and 182*b* at the outside also serve as stoppers so as not to separate the first spring 185*a* from the second spring.

For reference, the buckling refers to a phenomenon that when an in-plane compressive stress of a structure member reaches a limit value, a change (that is, flexural displacement or out-of-plane displacement) perpendicular to the compressive direction is rapidly increased.

Each of the first spring unit 180*a* and the second spring unit 180*b* further includes a stopper 187 and a tuber plate 186.

The stopper 187 serves to suppress the outer first case 181*a* and the outer second case 181*b* from being loosened from the inner first case 182*a* and the inner second case 182*b*, and the tuber plate 186 serves to adjust characteristics of the first spring 185*a* and the second spring. That is, the tuber plate 186 is added to ends of the first spring 185*a* and the second spring and as needed, the number of tuner plates 186 is controlled to control tensions of the first spring 185a and the second spring.

In the meantime, the motion converting unit includes a motor and a rotary unit, which will be described in more detail with reference to FIGS. 8A and 8B.

Figure 8A:
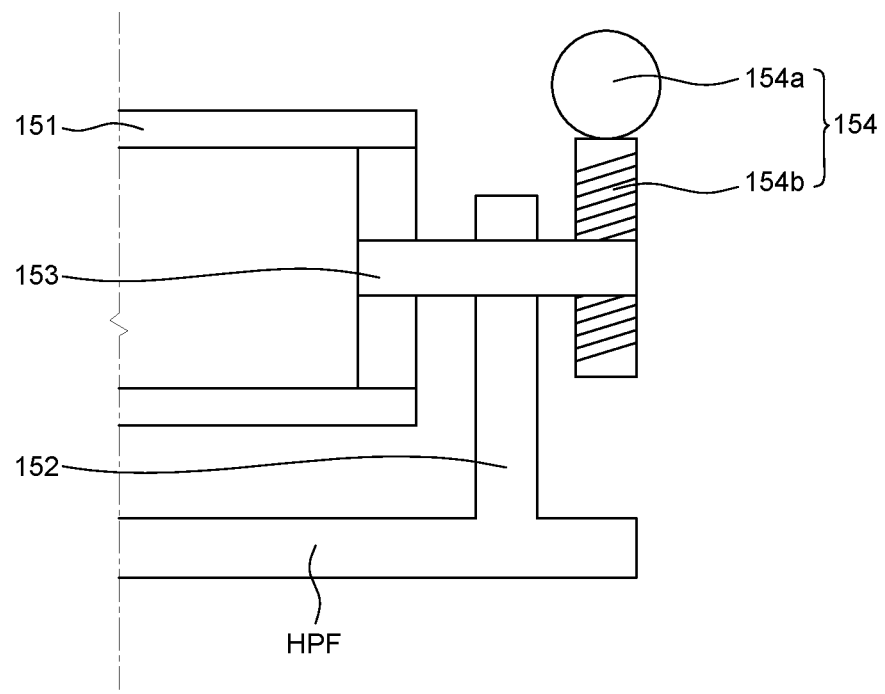
FIGS. 8A and 8B are views illustrating an example of a motion converting unit.
Figure 8B:
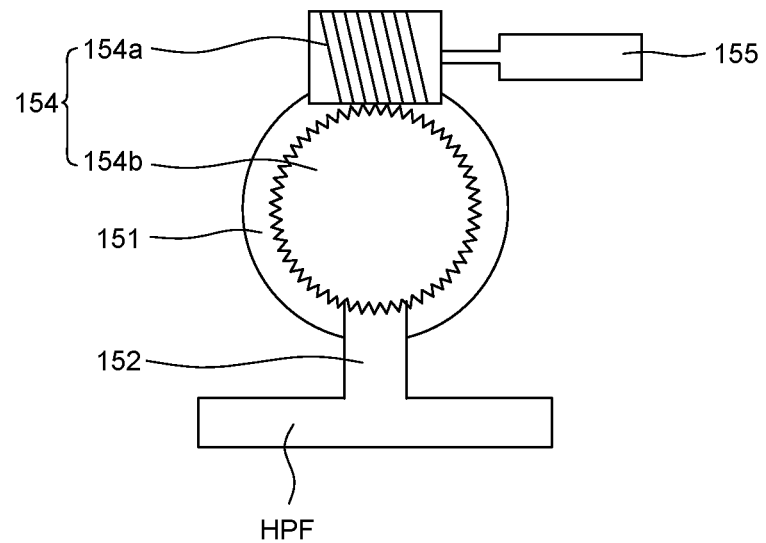

FIGS. 8A and 8B are views illustrating an example of a motion converting unit.

Figure 9:
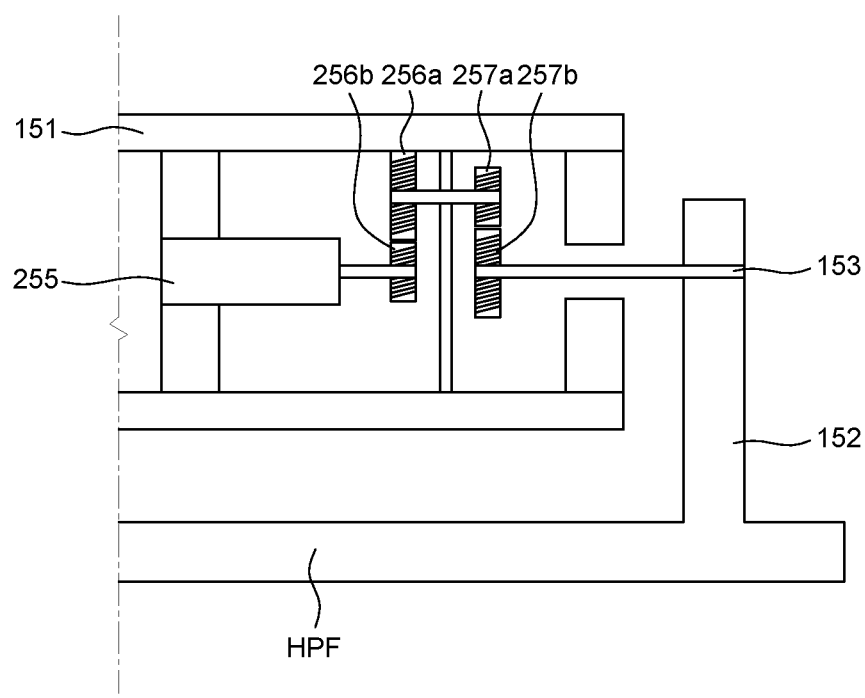
FIG. 9 is a view illustrating another example of a motion converting unit.

FIG. 9 is a view illustrating another example of a motion converting unit.

FIGS. 8A and 8B are a cross-sectional view and a side view illustrating an example that the motor 155 is disposed at the outside of the roller 151 and FIG. 9 is a cross-sectional view illustrating an example that the motor 255 is disposed in the roller 151, but the present disclosure is not limited thereto.

Referring to FIGS. 8A and 8B, the roller unit may include the roller 151 and the roller support unit 152.

The roller 151 is a member around which the display unit (not illustrated) is wound. The roller 151 may be, for example, formed to have a cylindrical shape. A lower edge of the display unit may be fixed to the roller 151.

The roller support unit 152 is disposed on the bottom surface HPF of the housing unit and the upper side surface of the roller support unit 152 may be rotatably coupled to both ends of the roller 151 by means of the rotary shaft 153.

A worm gear 154 is fastened with the end of the rotary shaft 153 at the outside of the roller 151 and is connected to the motor 155.

The worm gear 154 is configured by a worm 154a and a worm wheel 154b which is engaged therewith and axes of the worm 154a and the worm wheel 154b form a right angle. When the worm gear 154 is used, it is advantageous in that the cost and the noise are reduced and even though the power is disconnected, the current state is maintained.

Even though it is not illustrated, the motor 155 is connected to a power generating unit, such as a separate external power source or a built-in battery, to be supplied with the power. The motor 155 generates a torque to supply the torque to the roller 151 by means of the worm gear 154.

At this time, when the roller 151 rotates, the display unit which is fixed to the roller 151 through the lower edge may be wound around the roller 151. In contrast, when the roller 151 rotates in an opposite direction, the display unit which is wound around the roller 151 may be unwound from the roller 151.

Referring to FIG. 9, the roller unit may include the roller 151 and the roller support unit 152.

The roller support unit 152 is disposed on the bottom surface HPF of the housing unit and the upper side surface of the roller support unit 152 may be rotatably coupled to both ends of the roller 151 by means of the rotary shaft 153.

A pair of gears 257a and 257b is connected to one end of the rotary shaft 153 in the roller 151 and is connected to a motor 255 which is connected to the other pair of gears 256a and 256b. That is, the motor 255 is fixed to the inside of the roller 151 and supplies the torque to the roller 151 by means of two pairs of gears 256a, 256b, 257a, 257b.

One pair of gears 257a and 257b is configured by a first gear 257a and a second gear 257b having different gear ratios and the other pair of gears 256a and 256b is configured by a first gear 256a and a second gear 256b having different gear ratios but are not limited thereto.

Referring to FIG. 9, it is advantageous in that an overall volume of the motion converting unit may be minimized.

Even though it is not illustrated, the motor 255 is connected to a power generating unit, such as a separate external power source or a built-in battery, to be supplied with the power. The motor 255 generates a torque to supply the torque to the roller 151 by means of two pairs of gears 256a, 256b, 257a, 257b.

At this time, when the roller 151 rotates, the display unit which is fixed to the roller 151 through the lower edge may be wound around the roller 151. In contrast, when the roller 151 rotates in an opposite direction, the display unit which is wound around the roller 151 may be unwound from the roller 151.

Hereinafter, a process of ascending and descending the display unit using a lifting unit and a motion converting unit will be described in more detail with reference to FIG. 10.

Figure 10A:
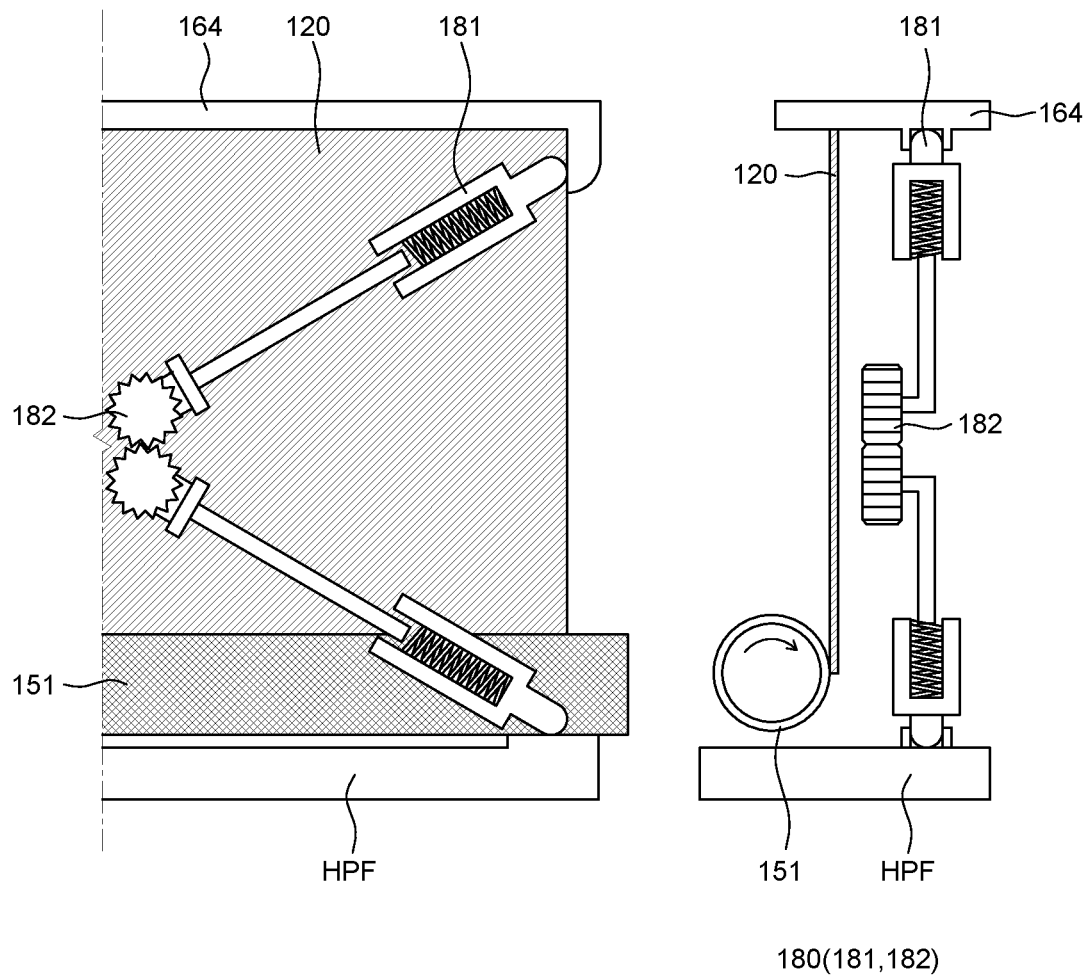
FIGS. 10A to 10C are views sequentially illustrating a process of ascending and descending a display unit by means of a lifting unit and a motion converting unit.
Figure 10B:
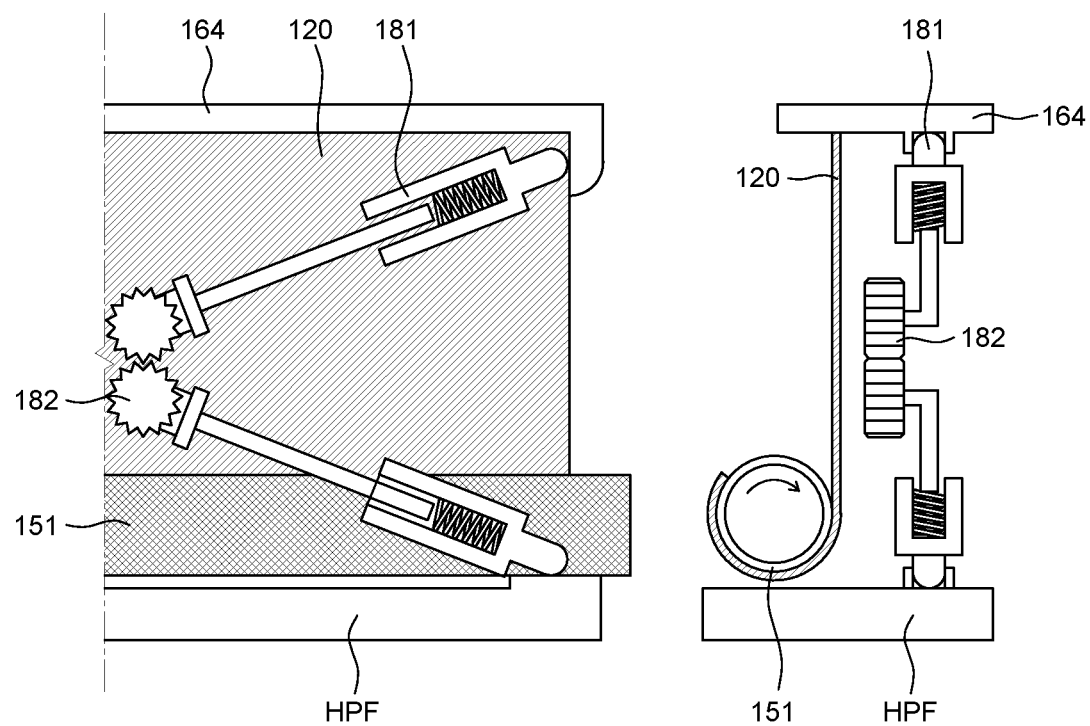
Figure 10C:
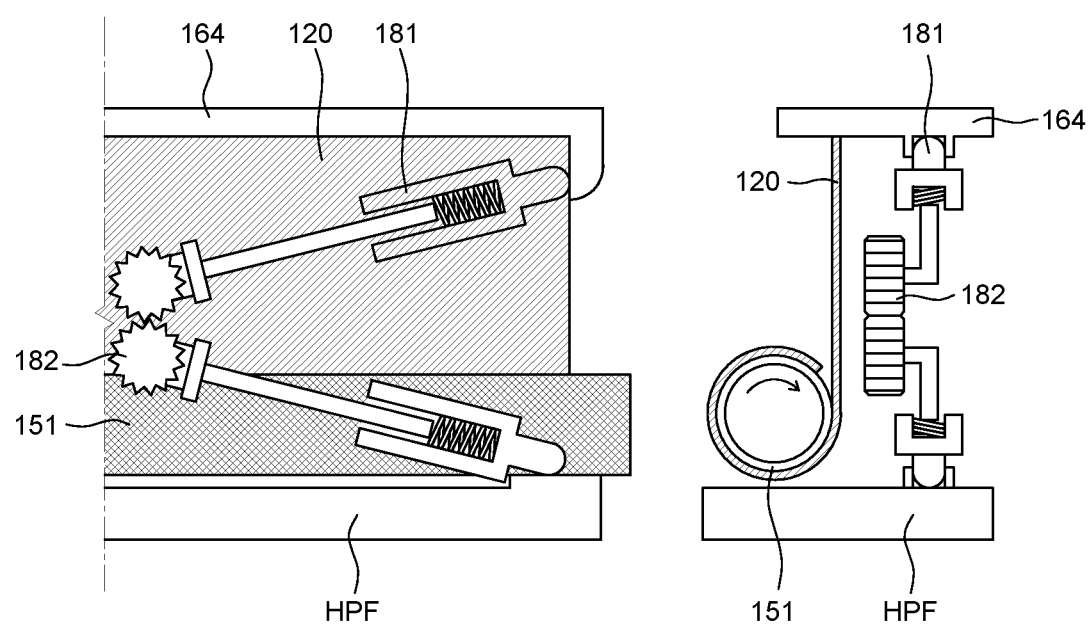

FIGS. 10A to 10C are views sequentially illustrating a process of ascending and descending a display unit by means of a lifting unit and a motion converting unit.

Left sides of FIGS. 10A to 10C illustrate a part of a front surface of the display device and right sides of FIGS. 10A to 10C schematically illustrate a cross-section of the display device.

For the convenience of description, FIGS. 10A to 10C illustrate an example where one spring units 180 are disposed in an upper portion and a lower portion, respectively, but the present disclosure is not limited thereto.

The motion converting unit interworks with the lifting unit to lift the display unit 120. The spring unit 180 of the lifting unit may be formed as a link structure with respect to the gear unit. When the display panel 120 is fully wound around the roller 151, the spring unit 180 of the lifting unit maintains a folded state. That is, when the display panel 120 is fully wound around the roller 151, the lifting unit 160 (FIGS. 4A and 4B) has the lowest height. When the display panel 120 is fully unwound, the spring unit 180 of the lifting unit maintains an unfolded state. That is, when the display panel 120 is fully unwound, the lifting unit 160 has the highest height.

Sequentially referring to FIGS. 10A to 10C, the winding process of the display panel 120 will be described. In order to wind the display panel 120 in a fully unwound state, the roller 151 rotates in a clockwise direction so that the display panel 120 is wound around the roller 151.

Specifically, in order to wind the display panel 120, the motor rotates in a direction of winding the display panel 120 around the roller 151 and the spring unit 180 is compressed to store the force. That is, four sets of spring units 180 are disposed to intersect each other with a shape of scissors with respect to the gear unit to be rotatably fastened by means of the gear unit. As the motor rotates in a direction of winding the display panel 120 around the roller 151, the inner case 182 of four sets of spring unit 180 are inserted into the outer case 181 so that the upper spring unit 180 and the lower spring unit 180 move to be close to each other. The display panel 120 is wound by the above-described process.

An unwinding process of the display panel 120 will be described. The motor rotates in an opposite direction to release the display panel 120 and thus the compressed spring unit 180 is uncompressed to move the upper spring unit 180 and the lower spring unit 180 to be spaced apart from each other to apply the tension to the display panel 120. Accordingly, the display panel 120 is unwound from the roller 151.

In some exemplary embodiments, a driving unit having another structure other than the above-described driving unit may be applied to the display device. That is, as long as the display unit is wound and unwound, the above-described configuration of the roller unit, the lifting unit, and the motion converting unit may be modified, some configuration may be omitted, or another configuration may be added.

Hereinafter, a design of the spring unit of the display device configured as described above will be described in more detail.

Figure 11:
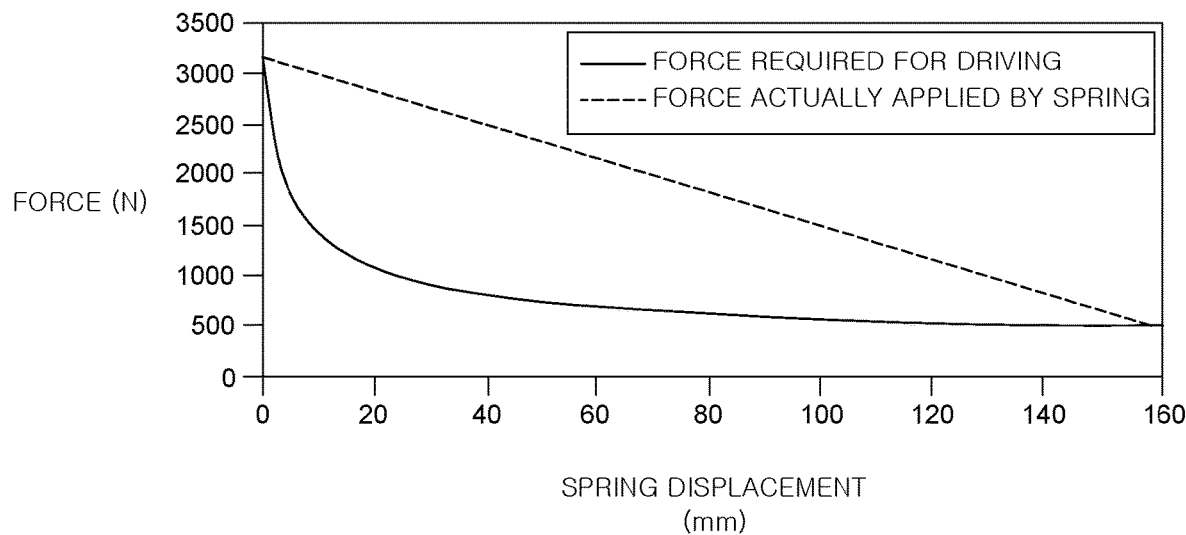
FIG. 11 is a simulation result illustrating an example of a force of a one-stage spring unit according to a spring displacement.

FIG. 11 is a simulation result illustrating a force according to a spring displacement for a one-stage spring unit as an example.

Figure 12:
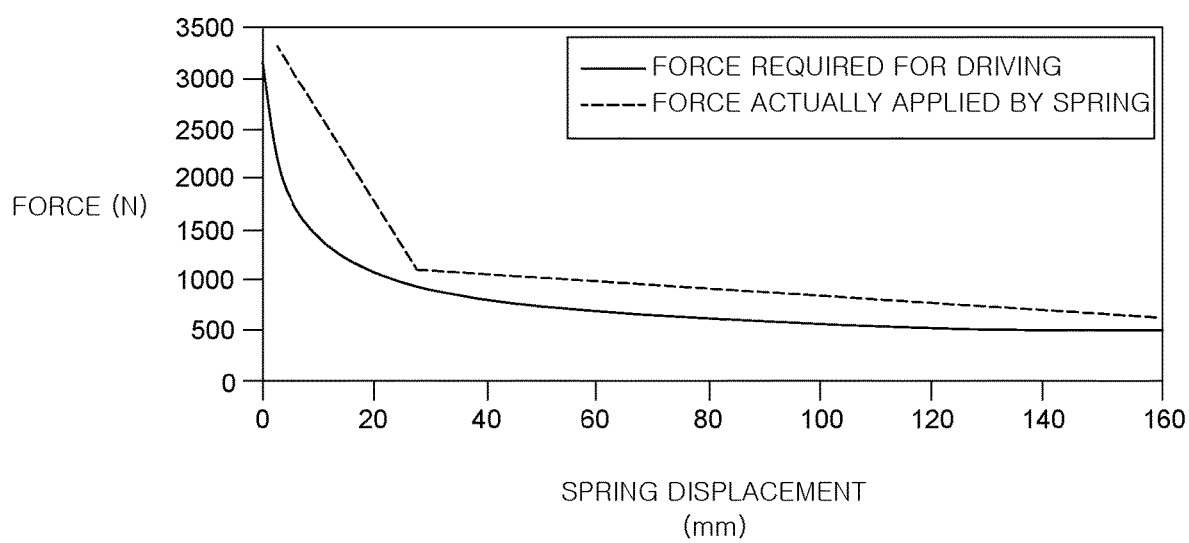
FIG. 12 is a graph obtained by applying a two-stage spring unit to a simulation result of FIG. 11.

FIG. 12 is a graph obtained by applying a two-stage spring unit to a simulation result of FIG. 11.

FIGS. 11 and 12 are results obtained by measuring a force required for driving when a load of 15 kg is downwardly applied to the display panel.

Referring to FIGS. 11 and 12, it is understood that in accordance with the increase of the spring displacement, a required force of the spring is exponentially reduced.

For example, it is understood that a force required for the spring at the beginning of unwinding the display panel is approximately 3224 N and a force required at the end of unwinding the display panel is approximately 466 N. In this case, a spring having a spring constant of approximately 16.88 kgf/mm and an initial length of 313.45 mm is applied as one stage.

As illustrated in FIG. 11, it is understood that a force is applied to be inversely proportion to the displacement, but a force actually required is a curved shape. When the required forces at the start point and the end point are determined according to the simulation result of FIG. 11, an excessive load may be applied to the display panel because the force is excessively applied in the middle point.

Even though a linear characteristic of the spring cannot be changed, if a plurality of springs sequentially operates to change an overall spring constant value of the springs at every stage, the load of the display panel may be reduced. Therefore, as illustrated in FIG. 12, according to the present disclosure, two or more springs are connected in series and each spring is restricted to operate only within a determined range. For example, when two springs having spring constants k1 and k2 are connected in series, a total spring constant k is k1×k2/(k1+k2) and when k2 is smaller than k1, the spring having a spring constant k1 operates after finishing an operation of the spring having a spring constant k2.

Figure 13:
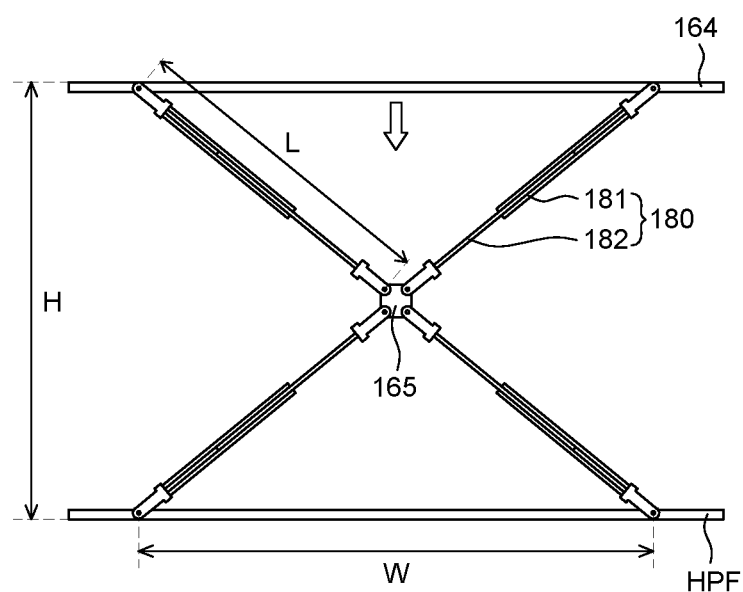
FIG. 13 is a view schematically illustrating a lifting unit including one-stage spring unit.

FIG. 13 is a view schematically illustrating a lifting unit including one-stage spring unit.

Figure 14:
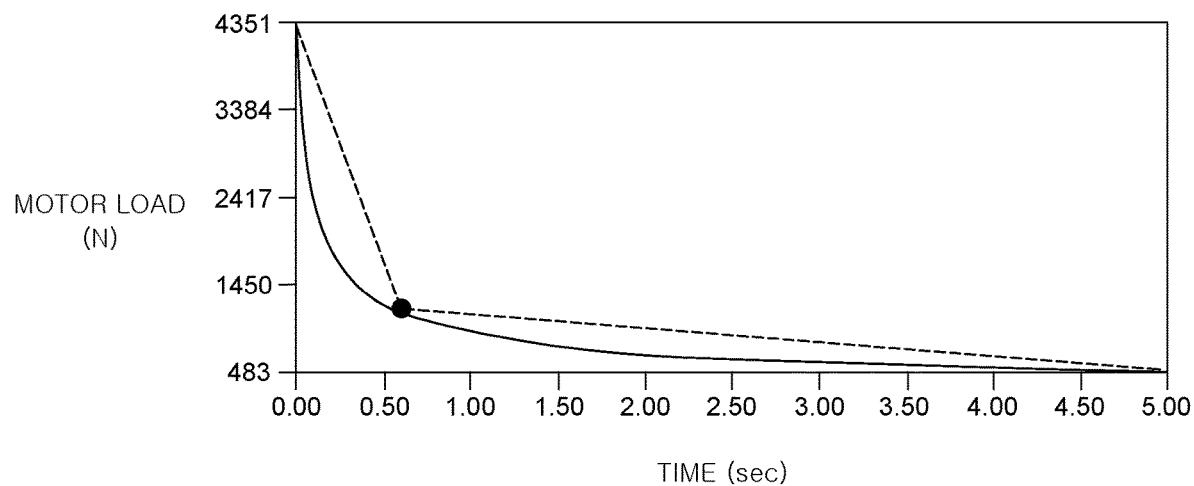
FIG. 14 is a simulation result illustrating an example of a motor load according to a time, in a spring unit of FIG. 13.

FIG. 14 is a simulation result illustrating an example of a motor load according to a time, in a spring unit of FIG. 13.

In FIGS. 13 and 14, a spring force required to drive the display panel was measured with respect to a downward load of 15 kg as represented in the arrow and a lifting unit having a width W and a height H, and a length L of the spring unit 180 which are 1229.6 mm, 129.3 mm to 985.3 mm, and 590.6 mm to 752.0 mm, respectively is illustrated as an example. Maximum values of the height H of the lifting unit and the length L of the spring unit 180 indicate an example that the display panel is fully unwound and minimum values of the height H and the length L of the spring unit 180 indicate an example that the display panel is fully wound.

Referring to FIGS. 13 and 14, it is understood that the motor load is exponentially reduced according to the time.

A required specification of the spring based on the size of the roller and the position of the display panel when the display panel is wound or unwound is selected based on the simulation result and a minimization point of the force may be calculated from the simulation result.

That is, for example, a minimization point P of the force of 1128.8 N at 0.64 s (a displacement of 20.66 mm) may be calculated.

The required specification of the spring may be calculated by calculating a linear graph from the start point, the minimization point P of the calculated force, and the end point. In this case, a weak spring has a spring constant of approximately 0.12 kgf/mm and an operation range of approximately 238.73 mm. Further, a strong spring has a spring constant of approximately 0.12 kgf/mm and an operation range of approximately 27.90 mm.

Figure 15:
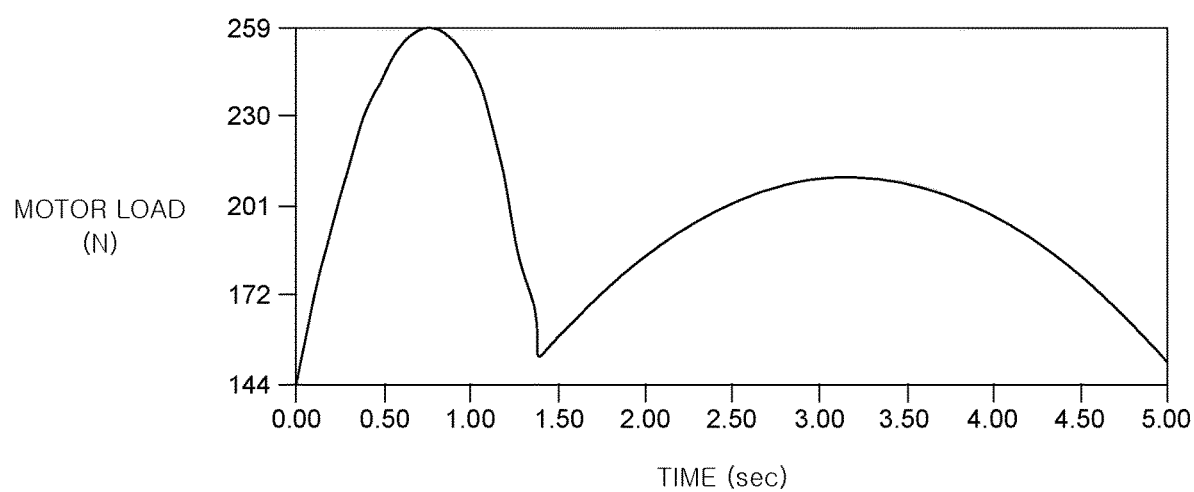
FIG. 15 is a simulation result illustrating an example of a motor load according to a time when a two-stage spring unit in which a simulation result of FIG. 14 is reflected is applied.

FIG. 15 is a simulation result illustrating an example of a motor load according to a time when a two-stage spring unit to which a simulation result of FIG. 14 is reflected is applied.

According to the above result, as the weak spring, a spring having a spring constant of approximately 0.13 kgf/mm and an operation range of approximately 250 mm is selected and as the strong spring, a spring having a spring constant of approximately 4.03 kgf/mm and an operation range of approximately 30 mm is selected.

Referring to FIG. 15, it is understood that a required force of the motor is at least 144 N to at most 259 N. It is further understood that the load on the motor is significantly reduced as compared with FIG. 14.

Figure 16:
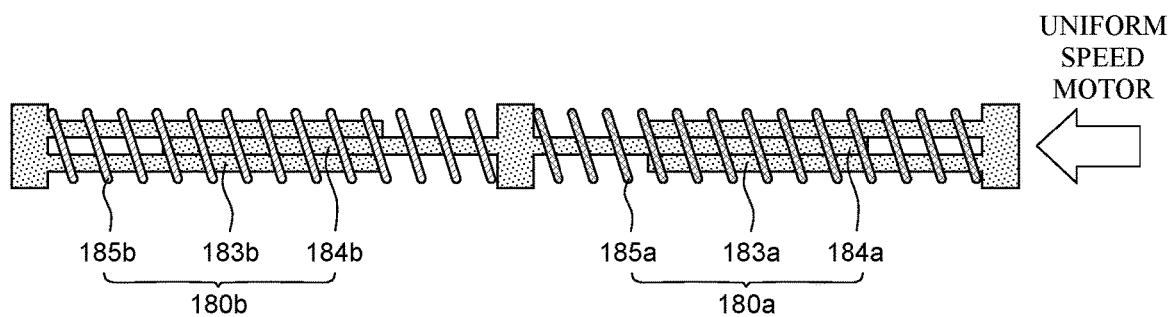
FIG. 16 is a view schematically illustrating a structure of a two-stage spring unit.

FIG. 16 is a view schematically illustrating a structure of a two-stage spring unit.

Figure 17:
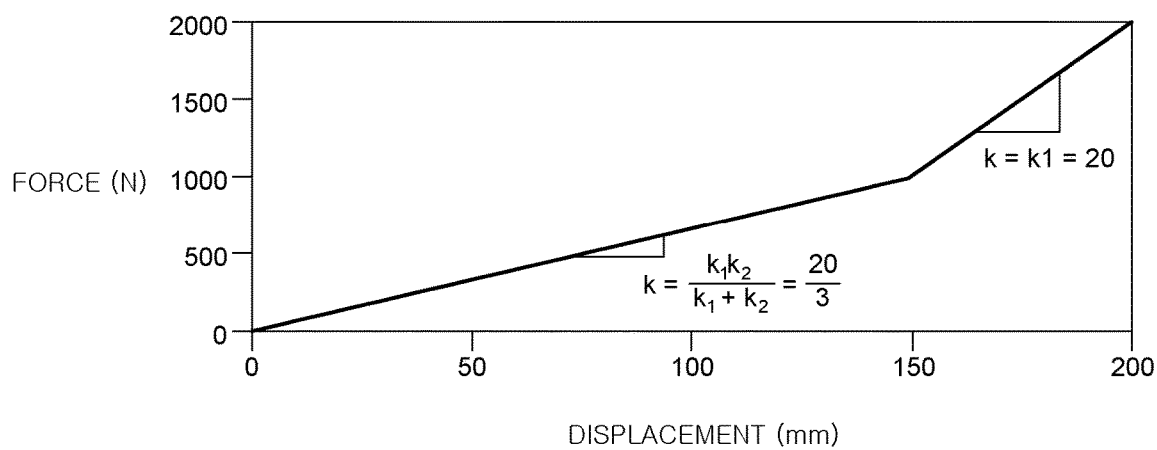
FIG. 17 is a simulation result illustrating a force of a two-stage spring unit according to a displacement.
Figure 18A:
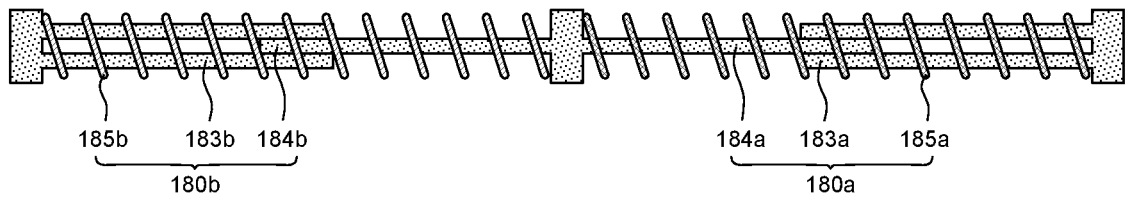
FIGS. 18A to 18D are views sequentially illustrating an operation according to the driving of a motor in a two-stage spring unit of FIG. 16.
Figure 18B:
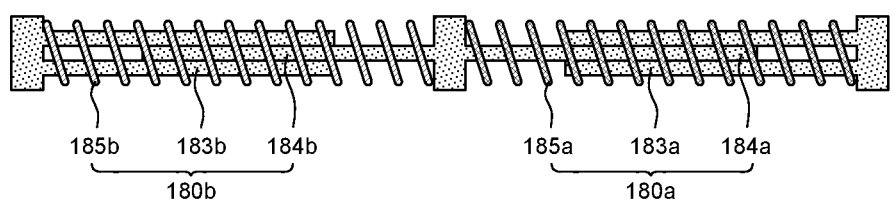
Figure 18C:
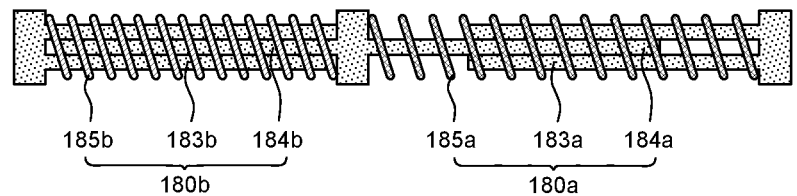
Figure 18D:
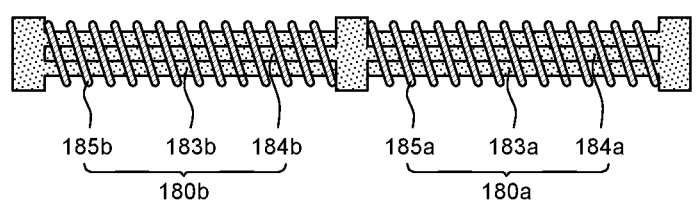

FIG. 17 is a simulation result illustrating a force of a two-stage spring unit according to a displacement.

FIGS. 18A to 18D are views sequentially illustrating an operation according to the driving of a motor in a two-stage spring unit of FIG. 16.

Referring to FIG. 16, the spring unit according to the first exemplary embodiment of the present disclosure is configured by two stages of a first spring unit 180a and a second spring unit 180b.

Further, according to the first exemplary embodiment of the present disclosure, the first spring unit 180a is configured by a first spring 185a having a relatively large spring constant and the second spring unit 180b is configured by a second spring 185b having a relatively small spring constant. In this case, a length of the second spring 185b may be formed to be longer than a length of the first spring 185a so that a length of the second spring unit 180b is also formed to be longer than a length of the first spring unit 180a but is not limited thereto.

The first spring unit 180a includes a first case which accommodates the first spring 185a and first shafts 183a and 184a. The second spring unit 180b includes a second case which accommodates the second spring 185b and second shafts 183b and 184b.

The first shafts 183a and 184a are configured by an outer first shaft 183a having a hollow cylindrical shape and an inner first shaft 184a which is inserted into the outer first shaft 183a. The second shafts 183b and 184b are configured by an outer second shaft 183b having a hollow cylindrical shape and an inner first shaft 184b which is inserted into the outer second shaft 183b.

The first spring 185a and the second spring 185b may be repeatedly compressed and uncompressed while being fitted into the first shafts 183a and 184a and the second shafts 183b and 184b.

Referring to FIG. 16, the first spring 185a and the second spring 185b have a length of approximately 210 mm, the spring constant k1 of the first spring 185a is set to be approximately 20 N/mm, and the spring constant k2 of the second spring 185b is set to be approximately 10 N/mm.

The outer first shaft 184a and the outer second shaft 184b are movable by approximately 100 mm to the left and the right.

The motor is installed at one end to calculate a required load after a uniform motion of 20 mm/s. That is, referring to FIGS. 17A, 18A to 18D, the same motor load is applied to both the first spring 185a and the second spring 185b, but the second spring 185b moves more at the same load to reach a threshold first (see FIG. 18C).

At this time, the threshold value refers to a state in which an end of the second shaft 184b is in contact with an inner end of the outer second shaft 183b so as not to move any more.

Until the second spring 185b reaches the threshold value, the first spring 185a and the second spring 185b act together so that a total spring constant k acts as k1×k2/(k1+k2)=20/3 N/mm. After the second spring 185b reaches the threshold value, only the first spring 185a acts so that the spring constant k is 20 N/mm (see FIGS. 18 and 18D). Therefore, values of the spring constants of the first spring 185a and the second spring 185b and lengths of the first shafts 183a and 184a and the second shafts 183b and 184b are adjusted to obtain a desired change of the spring constant K at a desired point.

In the meantime, the present disclosure is also applied to a three or more stage-spring unit, which will be described in more detail with reference to the following second exemplary embodiment of the present disclosure.

Figure 19:
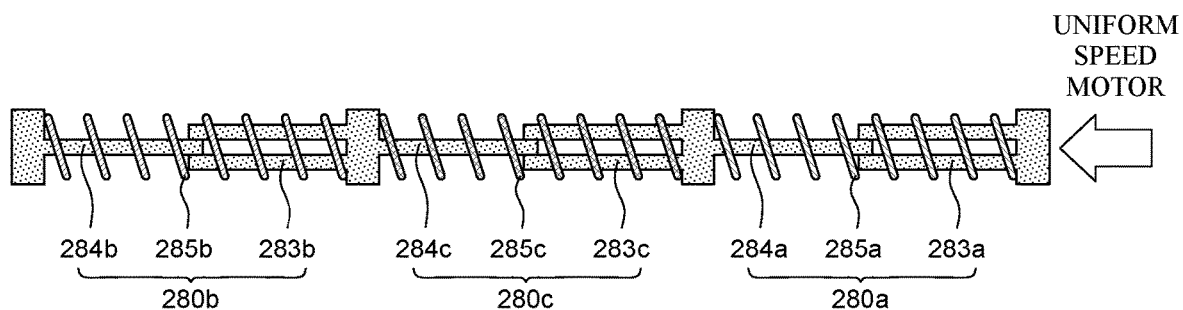
FIG. 19 is a view schematically illustrating a structure of a three-stage spring unit.

FIG. 19 is a view schematically illustrating a structure of a three-stage spring unit.

Figure 20:
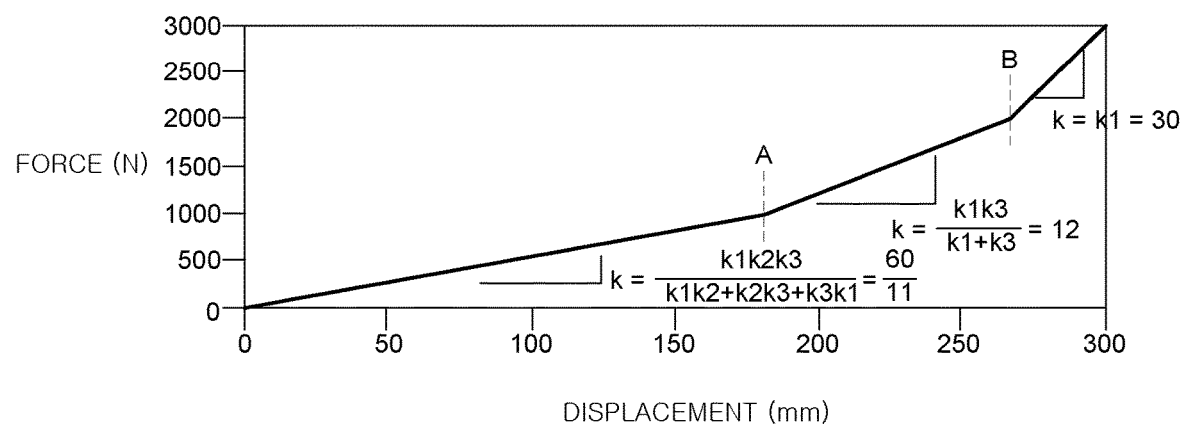
FIG. 20 is a simulation result illustrating a force of a three-stage spring unit according to a displacement.
Figure 21A:
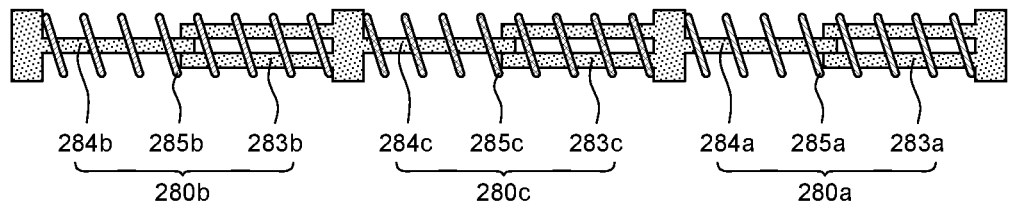
FIGS. 21A to 21E are views sequentially illustrating an operation according to the driving of a motor in a three-stage spring unit of FIG. 19.
Figure 21B:
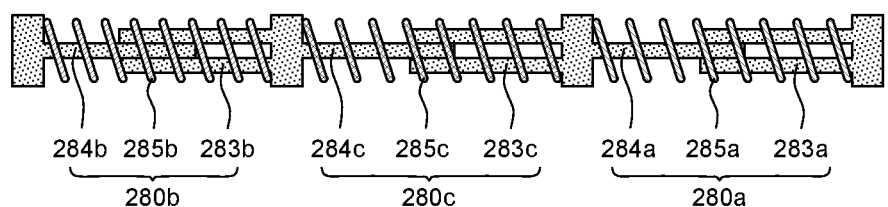
Figure 21C:
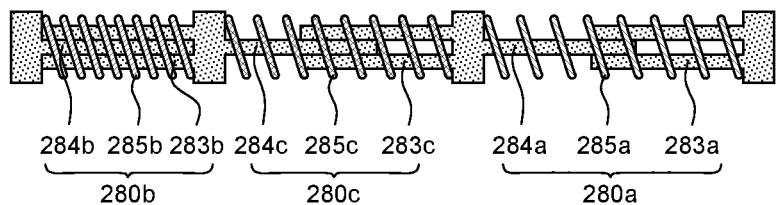
Figure 21D:
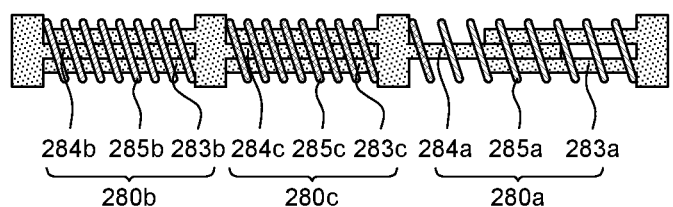
Figure 21E:
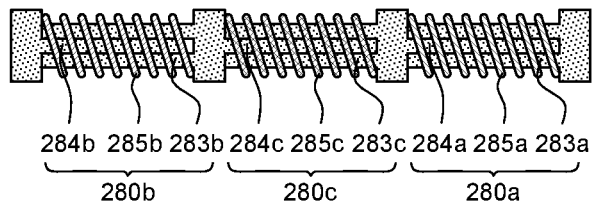

FIG. 20 is a simulation result illustrating a force of a three-stage spring unit according to a displacement.

FIGS. 21A to 21E are views sequentially illustrating an operation according to the driving of a motor in a three-stage spring unit of FIG. 19.

Referring to FIG. 19, the spring unit according to the second exemplary embodiment of the present disclosure is configured by three stages of a first spring unit 280a, a second spring unit 280b, and a third spring unit 280c.

According to the second exemplary embodiment of the present disclosure, the first spring unit 280a is configured by a first spring 285a having a relatively large spring constant, and the second spring unit 280b is configured by a second spring 285b having a relatively small spring constant. The third spring unit 280c is configured by a third spring 285c having an intermediate value between the spring constant of the first spring 285a and the spring constant of the second spring 285b.

The first spring unit 280a includes a first case which accommodates the first spring 285a and first shafts 283a and 284a. The second spring unit 280b includes a second case which accommodates the second spring 285b and second shafts 283b and 284b. Further, the third spring unit 280c includes a third case which accommodates the third spring 285c and third shafts 283c and 284c.

The first shafts 283a and 284a are configured by an outer first shaft 283a having a hollow cylindrical shape and an inner first shaft 283a which is inserted into the outer first shaft 284a. The second shafts 283b and 284b are configured by an outer second shaft 283b having a hollow cylindrical shape and an inner first shaft 284b which is inserted into the outer second shaft 283b. Further, the third shafts 283c and 284c are configured by an outer third shaft 283c having a hollow cylindrical shape and an inner third shaft 284c which is inserted into the outer third shaft 283c.

The first spring 285a, the second spring 285b, and the third spring 285c may be repeatedly compressed and uncompressed while being fitted into the first shafts 283a and 284a, the second shafts 283b and 284b, and the third shafts 283c and 284c.

Referring to FIG. 19, for example, the first spring 285a, the second spring 285b, and the third spring 285c have a length of approximately 210 mm. A spring constant k1 of the first spring 285a is set to approximately 30 N/mm, a spring constant k2 of the second spring 285b is set to approximately 10 N/mm, and a spring constant k3 of the third spring 285c is set to approximately 20 N/mm.

For example, an outer first shaft 284a, an outer second shaft 284b, and an outer third shaft 283c are movable by approximately 100 mm to the left and the right.

The motor is installed at one end to calculate a required load after a uniform motion of 60 mm/s. That is, referring to FIGS. 20, 21A to 21E, the same motor load is equally applied to all the first spring 285a, the second spring 185b, and the third spring 285c, but the second spring 285b moves more at the same load to reach a threshold first (see FIG. 21C).

At this time, the threshold value refers to a state in which an end of the second shaft 284b is in contact with an inner end of the outer second shaft 283b so as not to move any more.

Until the second spring 285b reaches the threshold value, the first spring 285a, the second spring 285b, and the third spring 285c act together. It is understood that a total spring constant k acts as k1k2k3/(k1k2+k2k3+k3k1)=60/11 N/mm and after the second spring 285b reaches the threshold value, the first spring 285a and the third spring 285c act together with k=k1k1/(k1+k3)=12 N/mm (see FIGS. 20 and 21D). Next, when the third spring 285c reaches the threshold value, it is understood that only the first spring 285a acts with k=30 N/mm (see FIGS. 20 and 21E). Therefore, values of the spring constants of the first spring 285a, the second spring 285b, and the third spring 285c and lengths of the first shafts 283a and 284a, the second shafts 283b and 284b, and the third shafts 283c and 284c are adjusted to obtain a desired change of the spring constant K at a desired point.

Figures 22, 23:
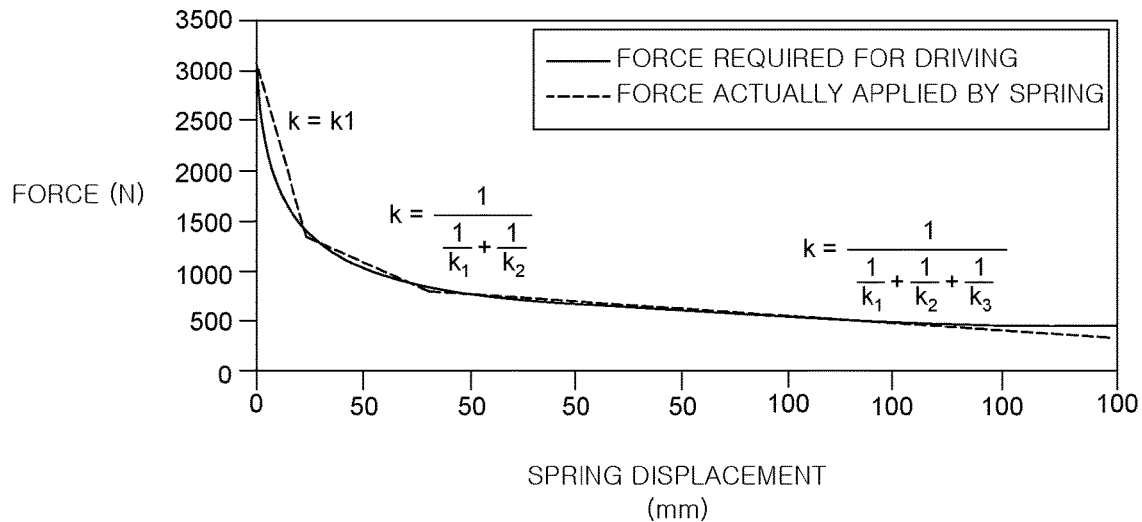
FIG. 22 is a simulation result illustrating a force of a three-stage spring unit according to a spring displacement as an example.
FIG. 23 is a table illustrating a spring characteristic of a three-stage spring unit calculated from a simulation result of FIG. 22 as an example.

FIG. 22 is a simulation result illustrating an example of a force of a three-stage spring unit according to a spring displacement.

FIG. 23 is a table illustrating a spring characteristic of a three-stage spring unit calculated from a simulation result of FIG. 22 as an example.

Figure 24:
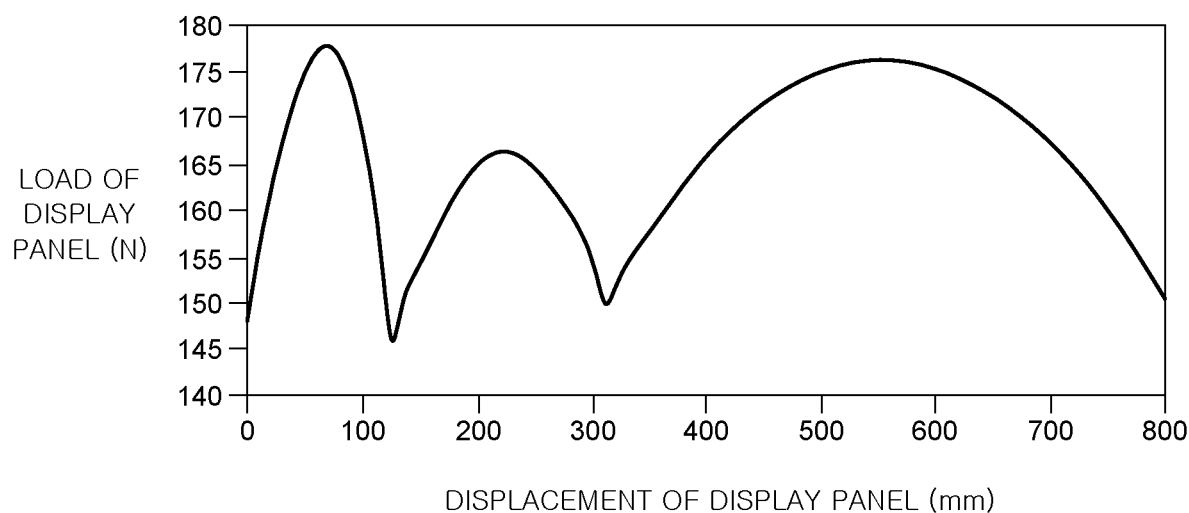
FIG. 24 is a simulation result illustrating a load of a display panel according to a displacement of a display panel when the three-stage spring unit of FIG. 23 is applied, as an example.

FIG. 24 is a simulation result illustrating a load of a display panel according to a displacement of a display panel when three-stage spring unit of FIG. 23 is applied, as an example.

Referring to FIG. 22, according to the above-described method, two points on the graph are selected to set a spring constant k and a displacement of the spring.

Referring to FIG. 23, for example, the spring constants of the first spring, the second spring, and the third spring are set to 171.14 N/mm, 3.35 N/mm, and 25.14 N/mm, respectively.

In this case, the lengths of the first spring, the second spring, and the third spring may be 50.19 mm, 466.13 mm, and 129.96 mm, respectively, and applied ranges of the first spring, the second spring, and the third spring may be 31.65 to 47.47 mm, 218.07 to 327.11 mm, and 74.28 to 111.42 mm, respectively. However, the present disclosure is not limited thereto.

Referring to FIG. 24, when the three-stage spring unit of FIG. 23 is applied, a load of the display panel is approximately 15 to 18 kgf so that the deviation is reduced as compared with the two-stage spring unit of 15 to 26 kgf. Theoretically, if three or more stages spring unit is added, a flatter graph can be obtained and the deviation of the load on the display panel is effectively reduced.

Figure 25:
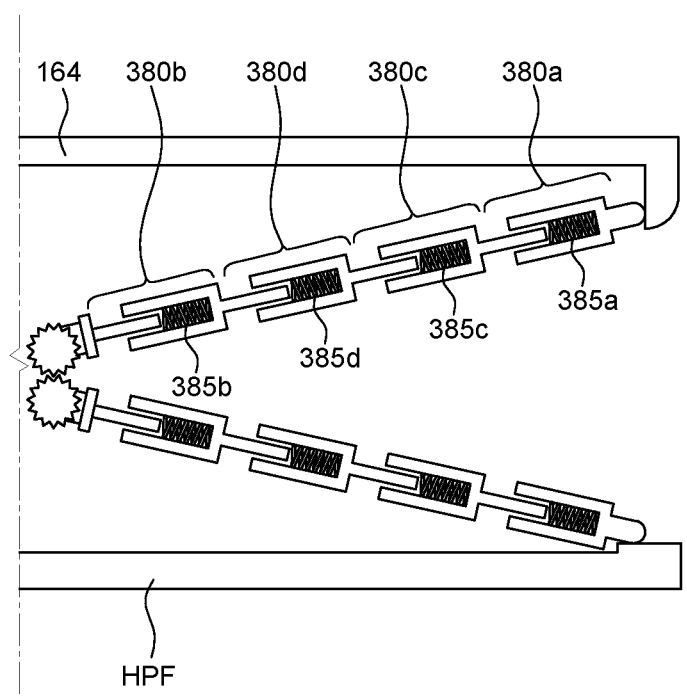
FIG. 25 is a view schematically illustrating a structure of a four-stage spring unit according to a third exemplary embodiment of the present disclosure.

FIG. 25 is a view schematically illustrating a structure of a four-stage spring unit according to a third exemplary embodiment of the present disclosure.

A display device according to a third exemplary embodiment of the present disclosure of FIG. 25 is different from the display device according to the first exemplary embodiment of FIGS. 4A to 7 in that four stages of spring units 380a, 380b, 380c, 380d are applied. However, the other configurations are substantially the same so that a redundant description will be omitted. The same configuration will be denoted with the same reference numeral.

Referring to FIG. 25, the spring unit according to the third exemplary embodiment of the present disclosure is configured by four stages of a first spring unit 380a, a second spring unit 380b, a third spring unit 380c, and a fourth spring unit 380d.

According to the third exemplary embodiment of the present disclosure, the first spring unit 380a is configured by a first spring 385a having a relatively large spring constant and the second spring unit 380b is configured by a second spring 385b having a relatively small spring constant. The third spring unit 380c is configured by a third spring 385c having an intermediate value between the spring constant of the first spring 385a and the spring constant of the second spring 385b. Finally, the fourth spring unit 380d is configured by a fourth spring 385d having an intermediate value between the spring constant of the second spring 385b and the spring constant of the third spring 385c. However, it is not limited thereto and the order of the first spring unit 380a, the second spring unit 380b, the third spring unit 380c, and the fourth spring unit 380d may be set in various ways.

Further, according to the present disclosure, the spring unit may be configured by five or more stages.

Figure 26A:
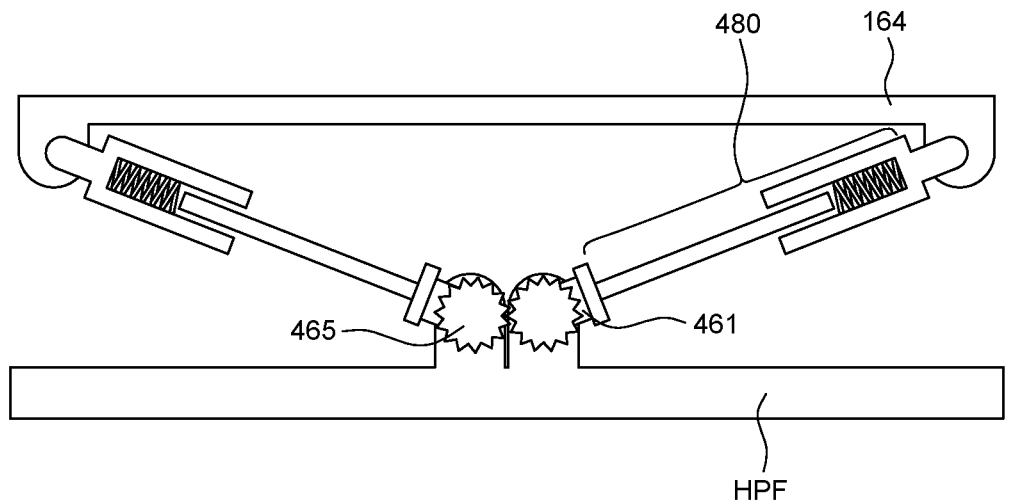
FIGS. 26A and 26B are views schematically illustrating a structure of a spring unit according to a fourth exemplary embodiment of the present disclosure.
Figure 26B:
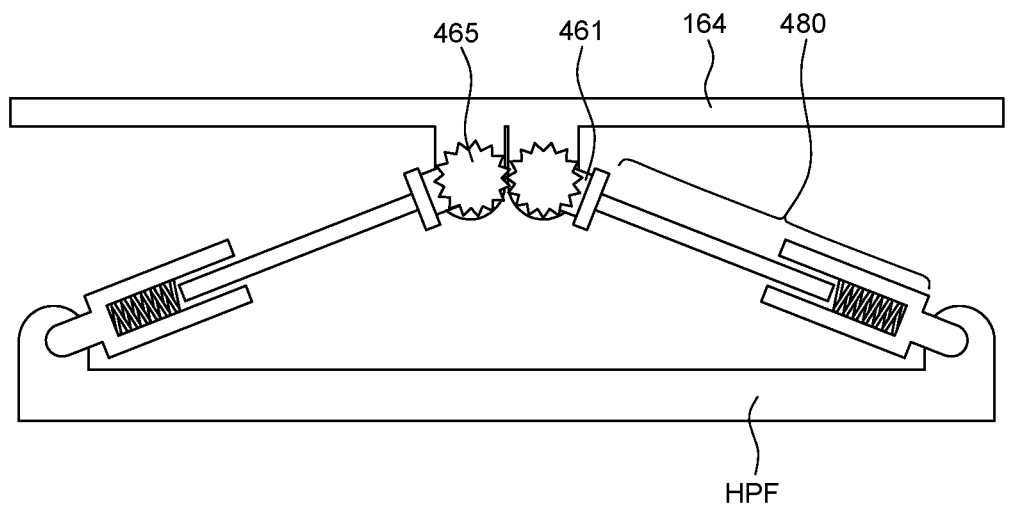

FIGS. 26A and 26B are views schematically illustrating a structure of a spring unit according to a fourth exemplary embodiment of the present disclosure.

A display device according to a fourth exemplary embodiment of the present disclosure of FIGS. 26A and 26B is different from the display device according to the first exemplary embodiment of FIGS. 4A to 7 in that a spring unit 480 is applied as two sets of upper stages or lower stages. However, the other configurations are substantially the same so that a redundant description will be omitted. The same configuration will be denoted with the same reference numeral.

In FIGS. 26A and 26B, for the convenience of description, it is illustrated that the spring unit 480 is configured by one stage, but it is not limited thereto and may be configured by two or more stages.

Referring to FIGS. 26A and 26B, the spring unit 480 according to the fourth exemplary embodiment of the present disclosure is configured by two sets of upper stages or lower stages.

The gear unit 465 may be installed at the center in which one ends of the spring units 480 of two sets of the upper stages or the lower stages meet or installed on the bottom surface HPF or installed in the head bar 164.

In this case, one ends of the two sets of spring units 480 are fastened with connection units 461 and two connection units 461 may be connected to be engaged with the gear unit 465.

Figure 27:
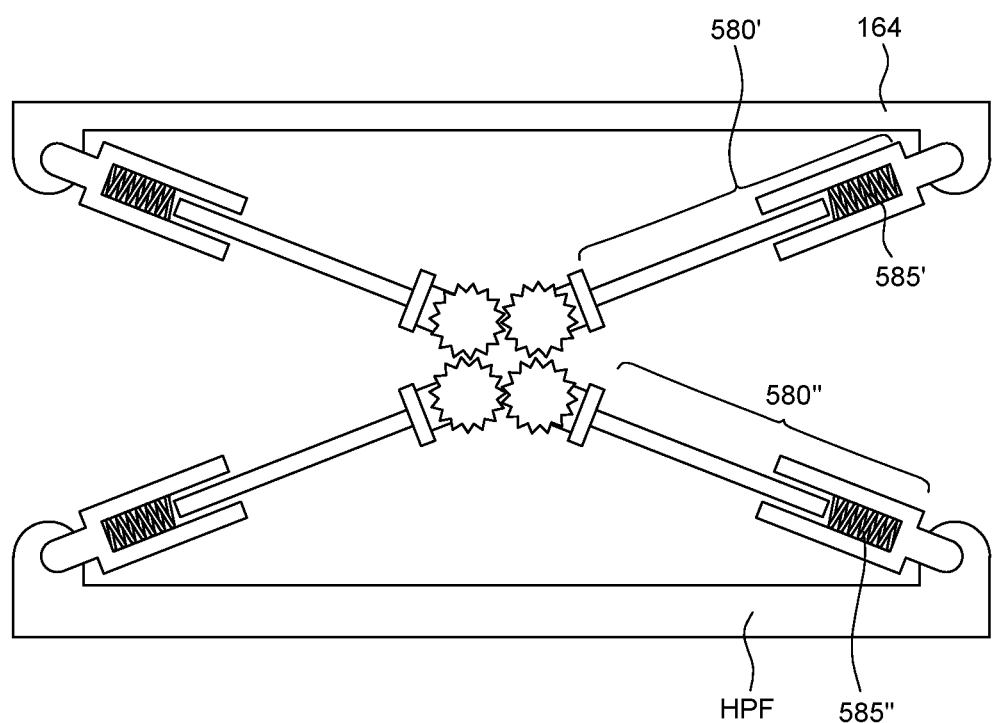
FIG. 27 is a view schematically illustrating a structure of a spring unit according to a fifth exemplary embodiment of the present disclosure.

FIG. 27 is a view schematically illustrating a structure of a spring unit according to a fifth exemplary embodiment of the present disclosure.

A display device according to a fifth exemplary embodiment of the present disclosure of FIG. 27 is different from the display device according to the first exemplary embodiment of FIGS. 4A to 7 in that an upper spring unit 580' and a lower spring unit 580" are configured to be different. However, the other configurations are substantially the same so that a redundant description will be omitted. The same configuration will be denoted with the same reference numeral.

In FIG. 27, for the convenience of description, it is illustrated that each of the spring units 580' and 580" is configured by one stage, but it is not limited thereto and may be configured by two or more stages.

Referring to FIG. 27, the spring units 580' and 580" according to the fifth exemplary embodiment of the present disclosure are configured by a total of four sets including two sets of upper spring units 580' and two sets of lower spring units 580".

Each of the upper spring unit 580' and the lower spring unit 580" includes a first spring 585' having a first spring constant and a second spring 585' having a second spring constant and the first spring constant and the second spring constant are different from each other.

The exemplary embodiments of the present disclosure can also be described as follows:

According to an aspect of the present disclosure, there is provided a display device. The display device includes a display unit including a display panel which displays an image, a head bar coupled to an upper end of the display unit, a roller which is coupled to a lower end of the display unit to wind or unwind the display unit and a lifting unit which is disposed on a rear surface of the display unit to move the display unit in a vertical direction, wherein the lifting unit may include four sets of spring units which may intersect with respect to a gear unit.

The display unit may further include a back cover which may be disposed on a rear surface of the display panel to support the display panel.

The display device may further include a motor which may be connected to the roller to rotate the roller.

The spring unit may include a first spring unit and a second spring unit.

The first spring unit may be disposed inside, and the second spring unit may be disposed at the outside, with respect to the gear unit.

The first spring unit may include a first spring having a relatively large spring constant and the second spring unit may include a second spring having a relatively small spring constant compared to the first spring.

The first spring unit may include a first case which may accommodate the first spring and a first shaft disposed in the first case and the second spring unit may include a second case which may accommodate the second spring and a second shaft disposed in the second case.

The first case may include an outer first case which has a hollow cylindrical shape and has a relatively larger outer diameter and an inner first case which has a relatively small outer diameter compared to the outer first case and the second case may include an outer second case which has a hollow cylindrical shape and has a relatively larger outer diameter and an inner second case which has a relatively small outer diameter compared to the outer second case.

The first outer first case and the outer second case may be in contact with each other to be fastened.

The first shaft may include an outer first shaft which is provided in the outer first case and has a hollow cylindrical shape and an inner first shaft which is provided in the inner first case and is inserted into the outer first shaft and the second shaft may include an outer second shaft which is provided in the outer second case and has a hollow cylindrical shape and an inner second shaft which is provided in the inner second case and is inserted into the outer second shaft.

The spring unit may include a first spring unit, a second spring unit, and a third spring unit.

With respect to the gear unit, the first spring unit may be located inside, the second spring unit may be located at the outside, and the third spring unit may be located between the first spring unit and the second spring unit.

The first spring unit may include a first spring having a relatively large spring constant, the second spring unit may include a second spring having a relatively small spring constant compared to the first spring, and the third spring unit may include a third spring having an intermediate value of the spring constant of the first spring and the spring constant of the second spring.

The first spring unit may include a first case which accommodates the first spring and a first shaft disposed in the first case, the second spring unit may include a second case which accommodates the second spring and a second shaft disposed in the second case, and the third spring unit may include a third case which accommodates the third spring and a third shaft disposed in the third case.

The first case may include an outer first case which has a hollow cylindrical shape and has a relatively larger outer diameter and an inner first case which has a relatively small outer diameter compared to the outer first case, the second case may include an outer second case which has a hollow cylindrical shape and has a relatively larger outer diameter and an inner second case which has a relatively small outer diameter compared to the outer second case, and the third case may include an outer third case which has a hollow cylindrical shape and has a relatively larger outer diameter and an inner third case which has a relatively small outer diameter compared to the outer third case.

The first shaft may include an outer first shaft which is provided in the outer first case and has a hollow cylindrical shape and an inner first shaft which is provided in the inner first case and is inserted into the outer first shaft, the second shaft may include an outer second shaft which is provided in the outer second case and has a hollow cylindrical shape and an inner second shaft which is provided in the inner second case and is inserted into the outer second shaft, and the third shaft may include an outer third shaft which is provided in the outer third case and has a hollow cylindrical shape and an inner third shaft which is provided in the inner third case and is inserted into the outer third shaft.

The four sets of spring units may be configured by two sets of upper spring units and two sets of lower spring units, and the upper spring unit and the lower spring unit may move to be spaced apart from each other or close to each other according to the rotation direction of the roller.

Each of the upper spring unit and the lower spring unit may include a first spring having a first spring constant and a first spring having a first spring constant, and the first spring constant and the second spring constant may have different values.

According to another aspect of the present disclosure, there is provided a display device. The display device includes a display unit including a display panel which displays an image, a head bar connected to an upper end of the display unit, a roller which is connected to a lower end of the display unit to wind or unwind the display unit and a lifting unit which is disposed on a rear surface of the display unit to move the display unit in a vertical direction, wherein the lifting unit may include a spring unit which may be configured by two sets of upper stages or lower stages to move to be spaced apart from each other or close to each other in accordance with a rotation direction of the roller.

The display device may further include a connection unit which is connected to each of one ends of two sets of spring units and a gear unit which is installed in the hear bar or on a bottom surface of the housing unit so that two connection units are engaged with each other.

According to still another embodiment of the present disclosure, a display device comprises a display panel configured to display an image; a roller coupled to the display panel and configured to wind the display panel in a first circular direction or unwind the display panel in a second circular direction; and a lifting unit coupled to the display panel and configured to move the display panel in a first vertical direction in response to the roller moving in the first circular direction or in a second vertical direction opposite the first vertical direction in response to the roller moving in the second circular direction, wherein the lifting unit includes a plurality of spring units, each of the spring units configured to compress in response to the roller moving in the first circular direction or decompress in response to the roller moving in the second circular direction.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a display unit including a display panel which displays an image;
a head bar coupled to an upper end of the display unit;
a roller which is coupled to a lower end of the display unit to wind or unwind the display unit; and
a lifting unit which is disposed on a rear surface of the display unit to move the display unit in a vertical direction,
wherein the lifting unit includes four sets of spring units which intersect with respect to a gear unit,
wherein each of the four spring units includes a first spring unit and a second spring unit, and
wherein the first spring unit includes a first spring having a first spring constant, and the second spring unit includes a second spring having a second spring constant, the first spring constant greater than the second spring constant.

2. The display device according to claim 1, wherein the display unit further includes a back cover which is disposed on a rear surface of the display panel to support the display panel.

3. The display device according to claim 2, further comprising:
a motor which is connected to the roller to rotate the roller.

4. The display device according to claim 1, wherein the first spring unit is disposed inside, and the second spring unit is disposed at the outside, with respect to the gear unit.

5. The display device according to claim 1, wherein the first spring unit includes a first case which accommodates the first spring and a first shaft disposed in the first case and
the second spring unit includes a second case which accommodates the second spring and a second shaft disposed in the second case.

6. The display device according to claim 5, wherein the first case includes an outer first case which has a hollow cylindrical shape and has a first outer diameter and an inner first case which has a second outer diameter that is smaller than the first outer diameter, and
the second case includes an outer second case which has a hollow cylindrical shape and has a third outer diameter and an inner second case which has a fourth outer diameter that is smaller than the third outer diameter.

7. The display device according to claim 6, wherein the outer first case and the outer second case are in contact with each other to be fastened.

8. The display device according to claim 6, wherein the first shaft includes an outer first shaft which is provided in the outer first case and has a hollow cylindrical shape and an inner first shaft which is provided in the inner first case and is inserted into the outer first shaft and
the second shaft includes an outer second shaft which is provided in the outer second case and has a hollow cylindrical shape and an inner second shaft which is provided in the inner second case and is inserted into the outer second shaft.

9. The display device according to claim 1, wherein the four sets of spring units are configured by two sets of upper spring units and two sets of lower spring units, and the upper spring unit and the lower spring unit move to be spaced apart from each other or close to each other according to the rotation direction of the roller.

10. The display device according to claim 9, wherein each of the upper spring unit and the lower spring unit includes a first spring having a first spring constant and a second spring having a second spring constant, and the first spring constant and the second spring constant have different values.

11. A display device, comprising:
a display unit including a display panel which displays an image;
a head bar coupled to an upper end of the display unit;
a roller which is coupled to a lower end of the display unit to wind or unwind the display unit; and
a lifting unit which is disposed on a rear surface of the display unit to move the display unit in a vertical direction,
wherein the lifting unit includes four sets of spring units which intersect with respect to a gear unit,
wherein each of the spring units includes a first spring unit, a second spring unit, and a third spring unit, and
wherein the first spring unit includes a first spring having a first spring constant, the second spring unit includes a second spring having a second spring constant smaller than the first spring constant, and the third spring unit includes a third spring having a third spring constant greater than the second spring constant but smaller than the first spring constant.

12. The display device according to claim 11, wherein with respect to the gear unit, the first spring unit is located inside, the second spring unit is located at the outside, and the third spring unit is located between the first spring unit and the second spring unit.

13. The display device according to claim 11, wherein the first spring unit includes a first case which accommodates the first spring and a first shaft disposed in the first case,
the second spring unit includes a second case which accommodates the second spring and a second shaft disposed in the second case, and
the third spring unit includes a third case which accommodates the third spring and a third shaft disposed in the third case.

14. The display device according to claim 13, wherein the first case includes an outer first case which has a hollow cylindrical shape and has a first outer diameter and an inner first case which has a second outer diameter smaller than the first outer diameter,
the second case includes an outer second case which has a hollow cylindrical shape and has a third outer diameter and an inner second case which has a fourth outer diameter smaller than the third outer diameter, and
the third case includes an outer third case which has a hollow cylindrical shape and has a fifth outer diameter and an inner third case which has a sixth outer diameter smaller than the fifth outer diameter.

15. The display device according to claim 14, wherein the first shaft includes an outer first shaft which is provided in the outer first case and has a hollow cylindrical shape and an inner first shaft which is provided in the inner first case and is inserted into the outer first shaft,
the second shaft includes an outer second shaft which is provided in the outer second case and has a hollow cylindrical shape and an inner second shaft which is provided in the inner second case and is inserted into the outer second shaft, and
the third shaft includes an outer third shaft which is provided in the outer third case and has a hollow cylindrical shape and an inner third shaft which is provided in the inner third case and is inserted into the outer third shaft.

16. A display device, comprising:
a display unit including a display panel which displays an image;
a head bar connected to an upper end of the display unit;
a roller which is connected to a lower end of the display unit to wind or unwind the display unit; and
a lifting unit which is disposed on a rear surface of the display unit to move the display unit in a vertical direction,
wherein the lifting unit includes a spring unit which is configured by two sets of upper stages or lower stages to move to be spaced apart from each other or close to each other in accordance with a rotation direction of the roller,
wherein the spring unit includes a first spring unit and a second spring unit, and
wherein the first spring unit includes a first spring having a first spring constant, and the second spring unit includes a second spring having a second spring constant, the first spring constant greater than the second spring constant.

17. The display device according to claim 16, further comprising:
a connection unit which is connected to each of one ends of two sets of spring units; and a gear unit which is installed in the head bar or on a bottom surface of the housing unit so that two connection units are engaged with each other.

18. A display device, comprising:
a display panel configured to display an image;
a roller coupled to the display panel and configured to wind the display panel in a first circular direction or unwind the display panel in a second circular direction; and
a lifting unit coupled to the display panel and configured to move the display panel in a first vertical direction in response to the roller moving in the first circular direction or in a second vertical direction opposite the first vertical direction in response to the roller moving in the second circular direction,
wherein the lifting unit includes a plurality of spring units, each of the spring units configured to compress in response to the roller moving in the first circular direction or decompress in response to the roller moving in the second circular direction,
wherein each of the plurality of spring units includes a first spring unit and a second spring unit, and
wherein the first spring unit includes a first spring having a first spring constant, and the second spring unit includes a second spring having a second spring constant, the first spring constant greater than the second spring constant.

19. The display device according to claim 18, wherein the roller is coupled to a lower end of the display panel.

20. The display device according to claim 18, further comprising a head bar coupled to an upper end of the display panel.

21. The display device according to claim 18, wherein the lifting unit is disposed on a rear surface of the display panel.

22. The display device according to claim 18, further comprising a first gear unit, the springs coupled to the first gear unit in first ends in directions intersecting each other with respect to the first gear unit.

23. The display device according to claim 22, further comprising a second gear unit, the second gear unit configured to translate movement of the roller in the first circular direction or the second direction into movement of the lifting unit in the first vertical direction or the second vertical direction, respectively.

24. The display device according to claim 18, wherein the first spring unit is disposed closer to a center of the display panel than the second spring unit is disposed.

25. A display device, comprising:
a display panel configured to display an image;
a roller coupled to the display panel and configured to wind the display panel in a first circular direction or unwind the display panel in a second circular direction; and
a lifting unit coupled to the display panel and configured to move the display panel in a first vertical direction in response to the roller moving in the first circular direction or in a second vertical direction opposite the first vertical direction in response to the roller moving in the second circular direction,
wherein the lifting unit includes a plurality of spring units, each of the spring units configured to compress in response to the roller moving in the first circular direction or decompress in response to the roller moving in the second circular direction,
wherein each of the spring units includes a first spring unit, a second spring unit, and a third spring unit, the first spring unit disposed closer to a center of the display panel than the second spring unit is disposed, and the second spring unit disposed closer to the center of the display panel than the third spring unit is disposed, and
wherein the first spring unit includes a first spring having a first spring constant,
the second spring unit includes a second spring having a second spring constant smaller than the first spring constant, and
the third spring unit includes a third spring having a third spring constant greater than the second spring constant but smaller than the first spring constant.

* * * * *